(12) United States Patent
Nakanishi et al.

(10) Patent No.: US 9,279,625 B2
(45) Date of Patent: Mar. 8, 2016

(54) HEAT SINK DEVICE FOR POWER MODULES OF POWER CONVERTER ASSEMBLY

(71) Applicant: Caterpillar Inc., Peoria, IL (US)

(72) Inventors: Todd G. Nakanishi, Brimfield, IL (US); Jon N. Husser, Peoria, IL (US); Keith E. Dixler, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 312 days.

(21) Appl. No.: 14/065,952

(22) Filed: Oct. 29, 2013

(65) Prior Publication Data

US 2015/0116938 A1    Apr. 30, 2015

(51) Int. Cl.

| | |
|---|---|
| H02B 1/00 | (2006.01) |
| H05K 7/20 | (2006.01) |
| F28D 15/00 | (2006.01) |
| B21D 53/02 | (2006.01) |
| F28F 3/00 | (2006.01) |
| B23P 15/26 | (2006.01) |

(52) U.S. Cl.
CPC . *F28F 3/00* (2013.01); *B23P 15/26* (2013.01); *H05K 7/20254* (2013.01); *H05K 7/20263* (2013.01); *H05K 7/20927* (2013.01); *B23P 2700/10* (2013.01); *Y10T 29/4935* (2015.01)

(58) Field of Classification Search
CPC ....... F28F 3/00; B23P 15/26; H05K 7/20263; H05K 7/20254
USPC ...................... 361/676–678, 679.46–679.54, 361/688–723, 831; 165/104.11; 29/890.03
See application file for complete search history.

(56) References Cited

U.S. PATENT DOCUMENTS

| | | | |
|---|---|---|---|
| 5,682,948 | A | 11/1997 | Bock |
| 7,869,208 | B2 | 1/2011 | Husser et al. |
| 8,441,827 | B2 | 5/2013 | Baker et al. |
| 2005/0121172 | A1 | 6/2005 | Lopatinsky |
| 2006/0002087 | A1 | 1/2006 | Bezama et al. |
| 2006/0254762 | A1 | 11/2006 | Tao et al. |
| 2007/0227697 | A1* | 10/2007 | Takahashi ............. H01L 23/473 165/80.4 |
| 2008/0239671 | A1* | 10/2008 | Amano ............... H01L 23/3735 361/699 |
| 2010/0165575 | A1 | 7/2010 | Husser et al. |
| 2010/0232111 | A1 | 9/2010 | Baker et al. |
| 2010/0254081 | A1 | 10/2010 | Koenig et al. |
| 2012/0125573 | A1* | 5/2012 | Rubenstein ............. F28D 15/00 165/104.33 |

(Continued)

FOREIGN PATENT DOCUMENTS

| | | |
|---|---|---|
| FR | 2975177 A1 | 11/2012 |
| JP | 08-126346 A | 5/1996 |

(Continued)

*Primary Examiner* — Courtney Smith
*Assistant Examiner* — Zhengfu Feng
(74) *Attorney, Agent, or Firm* — Leydig, Voit & Mayer, Ltd.

(57) ABSTRACT

A heat sink for power modules can be incorporated into a power module of a machine. In embodiments, an alloy is extruded to form a body with a plurality of divider webs integral thereto and defining a plurality of longitudinal passage segments inside the body. The body is machined to remove alternating end portions of the divider webs to define a fitting end turn area and a return end turn area disposed in opposing relationship with each other, thereby forming a serpentine fluid passage. A fitting end cap is welded to the body. A fluid inlet and a fluid outlet of the fitting end cap are respectively in fluid communication with a passage inlet and a passage outlet of the serpentine fluid passage.

8 Claims, 13 Drawing Sheets

(56) References Cited

U.S. PATENT DOCUMENTS

2012/0139096 A1* 6/2012 Gohara ............... H01L 23/3735
  257/706
2013/0058041 A1* 3/2013 Gohara ............... H01L 23/3735
  361/699

FOREIGN PATENT DOCUMENTS

| JP | 09-083164 A | 3/1997 |
| JP | 2002-368169 A | 12/2002 |
| JP | 2007-180307 A | 7/2007 |
| JP | 2011040554 | 2/2011 |

* cited by examiner

HEAT SINK DEVICE FOR POWER MODULES OF POWER CONVERTER ASSEMBLY

TECHNICAL FIELD

This patent disclosure relates generally to a heat sink for power modules, and, more particularly, to a heat sink for power modules used in a power converter assembly, such as, one adapted for use in an electric propulsion system of a machine, for example.

BACKGROUND

A device commonly referred to as a power converter is often used in electrical systems to receive electrical power from an electrical power source, such as, a generator; condition the electrical power; and supply the conditioned electrical power to one or more electrically-powered devices. During use, the power converter tends to generate unwanted heat. Dissipating the heat generated by the power converter can help improve the efficiency of the power converter and, in some instances, avoid damage or degradation of certain of the components.

Many standard power converters utilize an air cooling mechanism, such as, a fan, for example, to move cooling air over the various components to dissipate heat. However, air cooling may not be practical in some environments, such as, those which are debris-laden or wet, for example. Another technique for dissipating heat from power converter electronic components includes circulating a coolant fluid through or past a heat exchanger which is in thermal contact with electronic components of the power converter.

Japanese patent document JPH 0983164 is entitled, "Heat Sink and Its Manufacture," and is directed to a heat sink which is constituted of: an extruded material in which a through hole is formed, a fin which is inserted into the through hole, pipes which are fitted to round holes made in the extruded material, and a lid which closes an opening face at both ends of the through hole. A plurality of guide grooves for the fin are formed in two opposite faces of the through hole. The fin is composed of a plate-shaped part and rod-shaped extension parts which extend from both sides of the plate-shaped part. The fin is inserted into the through hole along the guide grooves formed in the through hole. The fin forms a plurality of coolant passages inside the through hole. The height of the rod-shaped extension parts of the fin is configured to be nearly equal to the depth of the guide grooves. Consequently, spaces, i.e., tank parts, by which the respective coolant passages communicate, are formed on both sides of the respective coolant passages partitioned by the fin part.

There is a continued need in the art to provide additional solutions for power converter cooling techniques. In particular, cooling fluid techniques for power converters tend to create various mechanical and structural challenges related to packaging the electronic components compactly while still allowing for sufficient heat dissipation. Thus, there is a continued need for additional solutions for power converter cooling that allow for an increased power module packing density with a desired thermal conductivity performance.

It will be appreciated that this background description has been created by the inventors to aid the reader, and is not to be taken as an indication that any of the indicated problems were themselves appreciated in the art. While the described principles can, in some respects and embodiments, alleviate the problems inherent in other systems, it will be appreciated that the scope of the protected innovation is defined by the attached claims, and not by the ability of any disclosed feature to solve any specific problem noted herein.

SUMMARY

In an embodiment, the present disclosure describes a heat sink for use in a power converter assembly. The heat sink includes a body and a fitting end cap. The body includes a fitting end, a return end in opposing relationship to the fitting end, and a heat transfer face extending along a longitudinal axis between the fitting end and the return end. The body defines a serpentine fluid passage inside the body. The serpentine fluid passage has a passage inlet and a passage outlet disposed at the fitting end.

The fitting end cap is connected to the fitting end of the body. The fitting end cap defines a fluid inlet and a fluid outlet respectively in fluid communication with the passage inlet and the passage outlet of the serpentine fluid passage.

The serpentine fluid passage includes a pair of longitudinal passage segments and a return end turn area. The pair of longitudinal passage segments is in fluid communication with each other through the return end turn area. Each of the pair of longitudinal passage segments has a longitudinal fluid flow cross-sectional area in a plane generally perpendicular to a flow of fluid through the respective longitudinal passage segment. The body includes a divider web, which is interposed between the pair of longitudinal passage segments and has a restrictor portion disposed in the return end turn area. The restrictor portion has a notched end defining a return end fluid flow cross-sectional area in a plane generally perpendicular to the flow of fluid through the return end turn area at the restrictor portion. A ratio of the return end fluid flow cross-sectional area to the longitudinal fluid flow cross-sectional area is in a range between about 9:10 and about 5:4.

In another embodiment, a power converter assembly is provided that includes a heat sink and a plurality of power modules. The heat sink includes a body having a fitting end, a return end in opposing relationship to the fitting end, and a heat transfer face extending along a longitudinal axis between the fitting end and the return end. The body defines a serpentine fluid passage inside the body. The serpentine fluid passage has a passage inlet and a passage outlet. The serpentine fluid passage includes a plurality of longitudinal passage segments extending along the longitudinal axis, a return end turn area, and a fitting end turn area. The plurality of longitudinal passage segments is in fluid communication with each adjacent longitudinal passage segment alternatingly through the return end turn area and the fitting end turn area.

The plurality of power modules is mounted to the heat transfer face of the body. The plurality of power modules is mounted in abutting, spaced relationship to each other over a packing distance along a power module mounting axis with a power module packing factor equal to at least about 0.85, wherein the power module packing factor is calculated as:

$$\text{power module packing factor} = 1 - \frac{(\text{packing distance} - \text{module distance})}{\text{module distance}},$$

where the module distance is a distance along the power module mounting axis the plurality of power modules would span if disposed in contacting relationship to each other.

In still another embodiment, a power converter assembly is provided that includes a heat sink and a plurality of power modules. The heat sink includes a body having a fitting end, a return end in opposing relationship to the fitting end, and a heat transfer face extending along a longitudinal axis between the fitting end and the return end. The body defines a serpentine fluid passage inside the body. The serpentine fluid passage has a passage inlet and a passage outlet. The serpentine fluid passage includes a plurality of longitudinal passage segments extending along the longitudinal axis, a return end turn area, and a fitting end turn area. The plurality of longitudinal passage segments is in fluid communication with each adjacent longitudinal passage segment alternatingly through the return end turn area and the fitting end turn area.

The plurality of power modules is mounted to the heat transfer face of the body. The plurality of power modules is mounted in abutting, spaced relationship to each other along a power module mounting axis with a power module density factor equal to at least about 0.85, wherein the power module density factor is calculated as:

$$\text{power module density factor} = 1 - \frac{(\text{heat sink distance} - \text{module distance})}{\text{module distance}},$$

where the heat sink distance is a distance along the power module mounting axis over which the heat sink extends, and the module distance is a distance along the power module mounting axis the plurality of power modules would span if disposed in contacting relationship to each other.

In yet another embodiment, a method of making a heat sink device is disclosed. In the method, an alloy is extruded to form a body. The body includes a fitting end, a return end in opposing relationship to the fitting end, and a heat transfer face extending along a longitudinal axis between the fitting end and the return end. The body is extruded such that a plurality of divider webs of the body define a plurality of longitudinal passage segments inside the body. The plurality of divider webs and the plurality of longitudinal passage segments extend from the fitting end to the return end. The plurality of longitudinal passage segments is disposed in spaced relationship to each other along a lateral axis perpendicular to the longitudinal axis. The body is machined to remove alternating end portions of the plurality of divider webs to define a fitting end turn area and a return end turn area disposed adjacent the fitting end and the return end, respectively, of the body.

A fitting end cap is connected to the fitting end of the body. A return end cap is connected to the return end of the body. A serpentine fluid passage is defined inside the body by the plurality of longitudinal passage segments, the return end turn area, and the fitting end turn area.

Further and alternative aspects and features of the disclosed principles will be appreciated from the following detailed description and the accompanying drawings. As will be appreciated, the principles related to power converters, heat sink devices, and methods of making the same disclosed herein are capable of being carried out in other and different embodiments, and capable of being modified in various respects. Accordingly, it is to be understood that both the foregoing general description and the following detailed description are exemplary and explanatory only and do not restrict the scope of the appended claims.

DETAILED DESCRIPTION

Figure 1:
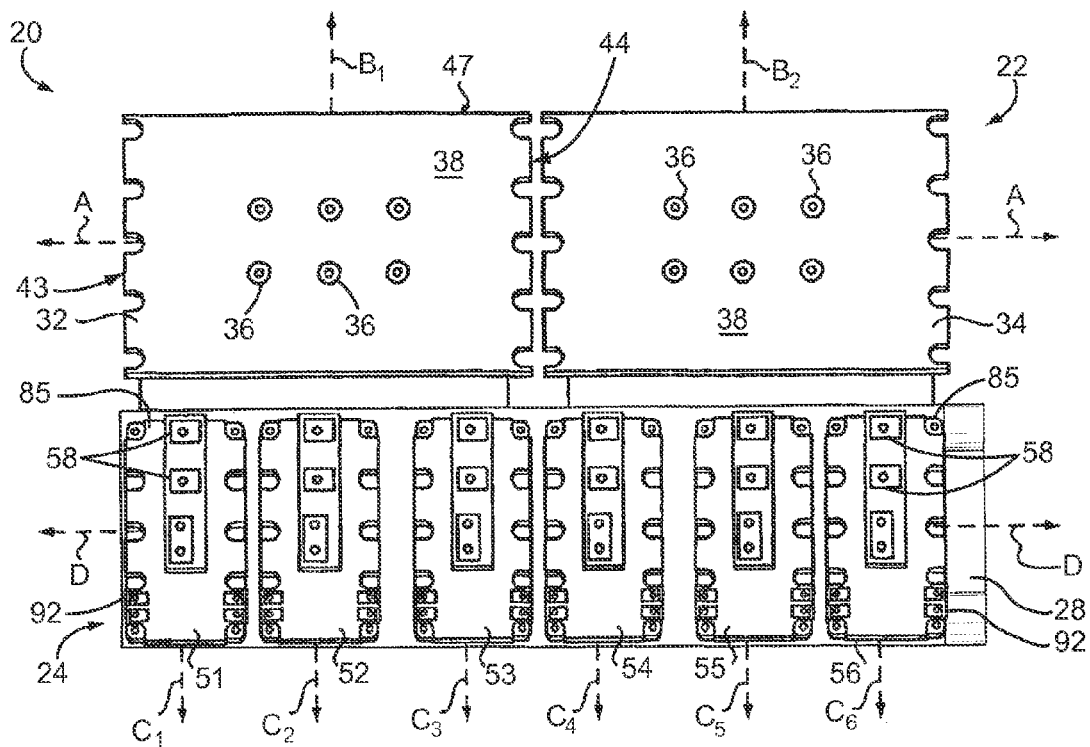
FIG. 1 is a top plan view of an embodiment of an assembly for a power converter constructed according to principles of the present disclosure.

Turning now to the Figures, there is shown in FIG. 1 an exemplary embodiment of an electronics assembly 20 for a power converter following principles of the present disclosure. In embodiments, the electronics assembly 20 may be used in a power converter such as a power converter assembly for a multiple phase AC electric drive propulsion system in a machine, as further described herein. The illustrated electronics assembly 20 includes a capacitor subassembly 22, a power module subassembly 24, and a heat sink 28.

The capacitor subassembly 22 can be adapted to condition electrical power in a power converter in any suitable manner known to those skilled in the art. The capacitor subassembly 22 can include a plurality of capacitor units 32, 34. In embodiments, any suitable capacitor unit can be used. The illustrated capacitor units 32, 34 each have a generally rectangular configuration, extending along a principal capacitor axis "A" and a transverse capacitor axis "$B_1$," "$B_2$" which is perpendicular to and bisects the corresponding principal capacitor axis "A."

The illustrated capacitor subassembly 22 is disposed in a first packaging arrangement in which the principal capacitor axes "A" are substantially co-linear with each other and the transverse capacitor axes "B₁," "B₂" are substantially parallel to, but not co-linear with, each other. In other embodiments, other packaging arrangements for the capacitor subassembly 22 can be used.

In the illustrated embodiment, the capacitor units 32, 34 are substantially the same. Accordingly, it should be understood that the description of one capacitor unit is applicable to the other, as well.

Each of the capacitor units 32, 34 can include a set of electrical capacitor connectors 36 which are disposed on an upper face 38 thereof and are adapted to electrically connect the capacitor with one or more other electrical components. Each capacitor unit 32, 34 includes six electrical capacitor connectors which are in electrical connection with conductive metal disposed within the respective capacitor unit 32, 34. In other embodiments, the capacitor subassembly 22 can include a different number of capacitor units, and/or each capacitor unit can include a different number of electrical capacitor connectors 36.

Figure 2:
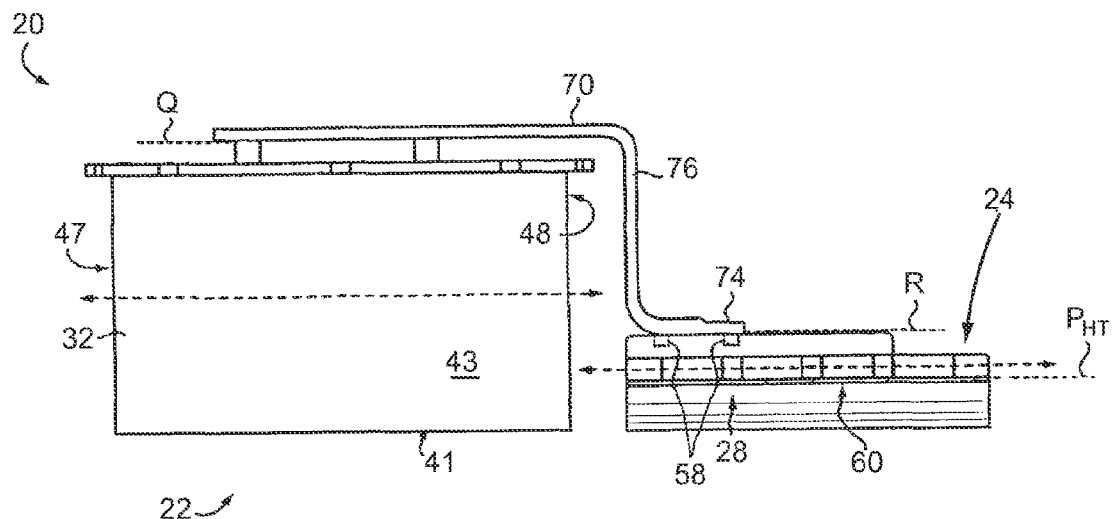
FIG. 2 is a side elevational view of a portion of the assembly of FIG. 1.

Referring to FIG. 2, the capacitor unit 32 includes a main body 59 with a bottom 41 in opposing relationship to the upper face 38, a pair of end surfaces 43, 44 in opposing relationship thereto, and a pair of side surfaces 47, 48 in opposing relationship thereto and extending between the end surfaces 43, 44. The upper face 38, the bottom 38, the end surfaces 43, 44, and the side surfaces 47, 48 can each comprise heat transfer surfaces for dissipating heat from the corresponding capacitor unit to a heat exchange element such as a heat sink or a power converter housing, for example. Referring to FIG. 2, the electrical capacitor connecters 36 project upwardly from the upper face 38 of the capacitor unit 32 and define a first connecting plane "Q."

Referring to FIG. 1, the power module subassembly 24 can be configured for power switching in a power converter in any suitable manner known to those skilled in the art. The power module subassembly 24 can include a plurality of power modules 51, 52, 53, 54, 55, 56. Each of the illustrated plurality of power modules 51-56 is in the form of an insulated gate bipolar transistor ("IGBT") module, a variety of which is well known and widely used in electrical power systems. The illustrated power module subassembly 24 includes six power modules 51-56. In embodiments, any suitable power module can be used, and a different number of power modules can be used.

Referring to FIG. 1, the illustrated power modules 51-56 are substantially the same, and each has a generally rectangular configuration extending along a principal module axis "C₁-C₆" and a transverse module axis "D" which is perpendicular to and bisects the respective principal module axis "C₁-C₆." It will be understood that the description of one power module is applicable to each of the other power modules, as well.

The power module subassembly 24 can be disposed in a second packaging arrangement where each of the principal module axes "C₁-C₆" of the power modules 51-56 are substantially parallel to, but not co-linear with, one another and each of the transverse module axes "D" are substantially co-linear with one another. The illustrated principal module axes "C₁-C₆" are substantially parallel, but not coplanar, with the transverse capacitor axes "B₁," "B₂." Further, the principal capacitor axis "A" can be oriented substantially perpendicular to, and non-coplanar with, the principal module axes "C₁-C₆."

Each power module 51-56 includes a plurality of electrical power connectors 58 that can be adapted to electrically connect the power module 30 to the capacitor subassembly 22 and to power input and output components of a power converter, as further described herein. In embodiments, each power module 51-56 can include a different number of electrical power connectors 58.

Referring to FIG. 2, each power module 51-56 can include a heat dissipation surface 60, which in the illustrated embodiment is in the form of a substantially planar panel. Further, in the second packaging arrangement, each of the heat dissipation surfaces 60 of the power modules 51-56 is disposed in a common heat transfer plane "$P_{HT}$." The electrical power connectors 58 of the power modules 51-56 can define a power module connecting plane "R" which can be substantially parallel and non-coplanar with the capacitor connecting plane "Q" in embodiments. In embodiments, the heat transfer plane "$P_{HT}$" can be substantially parallel with both the power module connecting plane "R" and the capacitor connecting plane "Q," and non-coplanar therewith.

Referring to FIG. 2, embodiments of a heat sink 28 constructed according to principles of the present disclosure can be arranged with the power module subassembly 24 to enable heat dissipation during operation, while allowing the power modules 51-56 to be positioned in a relatively dense and compact configuration. The illustrated heat sink 28 is disposed in underlying relationship to the power module subassembly 24. The common heat transfer plane "$P_{HT}$" of the power module subassembly is in overlying relationship with the heat sink 28 to facilitate the heat transferring relationship between the heat sink 28 and the power module subassembly 24. In embodiments, the power modules 51-56 of the power module subassembly 24 are mounted directly to the heat sink 28 such that each heat dissipation surface 60 is in heat transferring relationship with the heat sink.

Referring to FIG. 2, an electrical connecting device, namely, a DC bus bar 70, can be provided to electrically connect the power module subassembly 24 and the capacitor subassembly 22. In embodiments, the DC bus bar 70 can include a first bus bar end 72, which extends along the capacitor connecting plane "Q" and is electrically connected to the electrical capacitor connectors 36 of the capacitor subassembly 22, and a second bus bar end 74, which extends along the power module connecting plane "R" and is electrically connected to the electrical power connectors 58 of the power module subassembly 24. The DC bus bar 70 can include a stepped profile defined by an intermediate portion 76 extending between the first and second DC bus bar ends 72, 74.

In embodiments, any suitable DC bus bar can be used. In embodiments, the DC bus bar 70 can be constructed from laminated conductive sheets which are electrically separated from each other.

Figure 3:
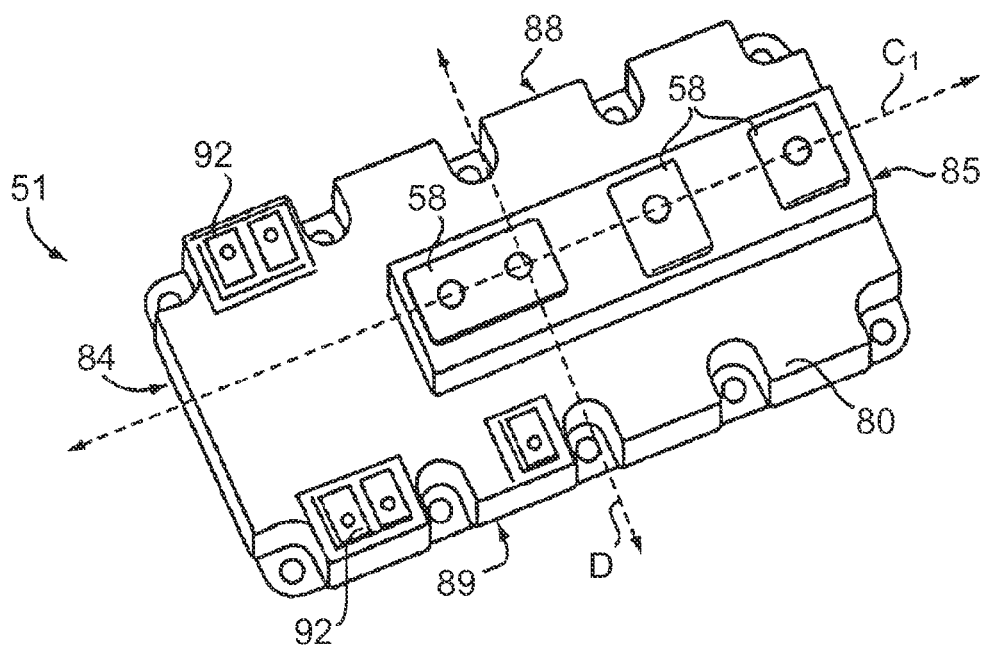
FIG. 3 is a top perspective view of an embodiment of a power module in the form of an insulated gate bipolar transistor ("IGBT") module which can be used in embodiments of a power converter constructed according to principles of the present disclosure.
Figure 4:
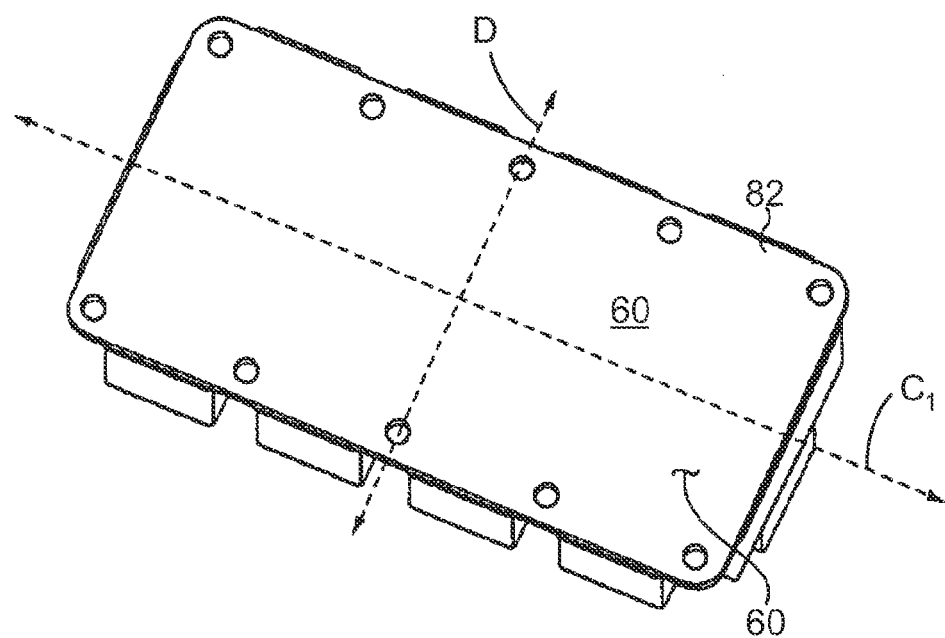
FIG. 4 is a bottom perspective view of the power module of FIG. 3.

Referring to FIGS. 3 and 4, one of the power modules 51 of the power module subassembly 24 is shown. The following description of the power module 51 should be understood to be applicable to the other power modules 52-56 of the power module subassembly 24, as well. In other embodiments, the power module subassembly 24 can include different types of power modules.

The power module 51 can include an upper face 80 and a bottom 82 in opposing relationship thereto. In embodiments, the bottom 82 comprises a heat dissipation surface 60. The electrical power connectors 58 project from the upper face 80. The bottom 82 comprises a heat transfer panel made from a thermally-conductive material, such as a metallic material, for example, whereupon the heat dissipation surface 60 is located. The power module 51 is generally rectangular and includes first and second ends 84, 85 in opposing relationship thereto, and a pair of sides 88, 89 in opposing relationship thereto and extending between the ends 84, 85. The principal module axis "C₁" intersects the first and second ends 84, 85. The transverse module axis "D" intersects the sides 88, 89.

Referring to FIG. 3, the power module 51 can include a plurality of electrical control connectors 92 which are configured to allow the power module 51 to be electrically connected to a controller adapted to control power switching in each power module 51-56. The electrical power connectors 58 and the electrical control connectors 92 of the power module 51 are asymmetrically arranged about both the principal module axis "C₁" and the transverse module axis "D." The arrangement of the electrical power connectors 58 and the electrical control connectors 92 may be understood to provide the power module 51 with a polarity or a module orientation. Referring to FIG. 1, each of the power modules 51-56 has an identical module orientation within the second packaging arrangement, as defined by an arrangement of their respective electrical power connectors 58 and electrical control connectors 92.

Each of the power modules 51-56 can be arranged such that one of the first and second ends 84, 85 of each of the power modules 51-56, such as the second end 85 having one of the electrical power connectors 58 located adjacent thereto, is positioned adjacent to and abuts the capacitor subassembly 22.

Figure 5:
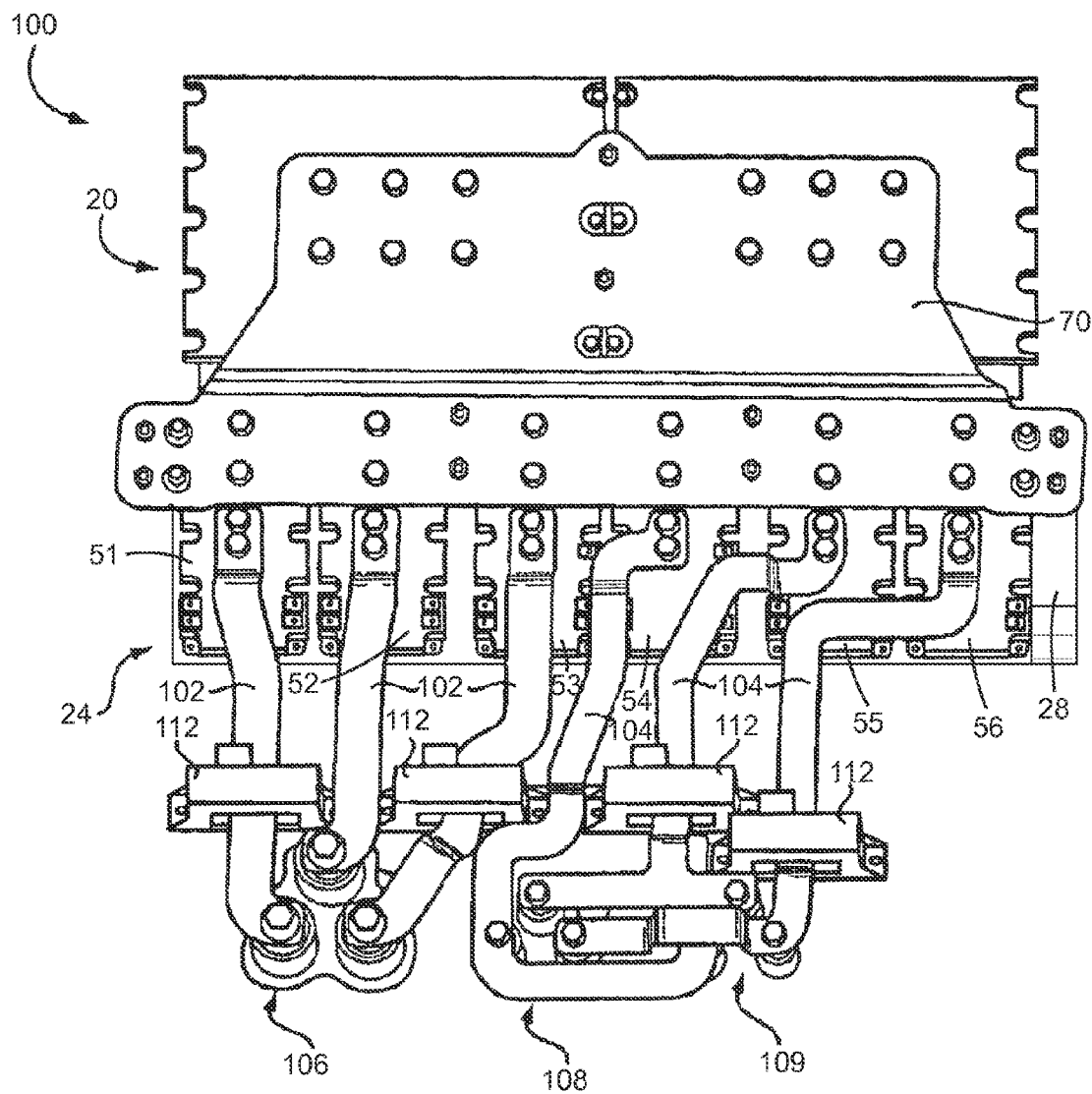
FIG. 5 is a top plan view of an embodiment of an assembly for a power converter constructed according to principles of the present disclosure.

Referring to FIG. 5, a power converter assembly 100 according to one embodiment is provided that includes the electronics assembly 20 of FIG. 1. The power converter assembly 100 of FIG. 5, includes the electronics assembly 20 with the DC bus bar 70 secured thereto, first and second sets of AC electrical connection bars 102, 104, an AC input interface 106, first and second AC output interfaces 108, 109, and a plurality of current sensors 112. The power converter assembly 100 is shown in a top view and is arranged in preparation for placing the power converter assembly 100 in service in a power converter housing.

The first set of AC electrical connection bars is are electrically connected to a first set of three of the power modules 51, 52, 53 of the power module subassembly 24 and the AC input interface 106. The AC input interface 106 can be adapted to receive a multiple phase AC input, such as a three-phase AC input, for example, from a source of electrical power, such as, an electrical generator, for example. The first set of three power modules 51, 52, 53 of the power module subassembly 24 coupled with the AC input interface 106 can comprise a power converter which transforms an AC input to a DC output at the capacitor subassembly 22.

The second set of AC electrical connection bars 104 is electrically connected to a second set of three power modules 54, 55, 56 of the power module subassembly 24 and to the first AC output interface 108 and the second AC output interface 109. The three power modules 54, 55, 56 of the second set of the power module subassembly 24 coupled with the first and second AC output interfaces 108, 109 can comprise a power inverter which transforms a DC input from the capacitor subassembly 22 to an AC output. The AC output interfaces 108, 109 can be adapted to be electrically connected to an electrically-powered device, as further described herein. The plurality of current sensors 112 can be electrically coupled with the first and second set of electrical connection bars 102, 104 in any suitable manner known to those skilled in the art.

When the electronics assembly 20 is installed in an electric drive machine, the direction of power flow may be changed during braking such that the AC input interface 106 acts as an AC output interface and the AC output interfaces 108, 109 act as AC input interfaces. Accordingly, it will be understood that the terms "input" and "output" are only used for convenient reference and that the phrase "power converter" embraces arrangements in which the direction of power flow is changed either from AC or DC and/or the direction of power flow can be reversed.

Figure 6:
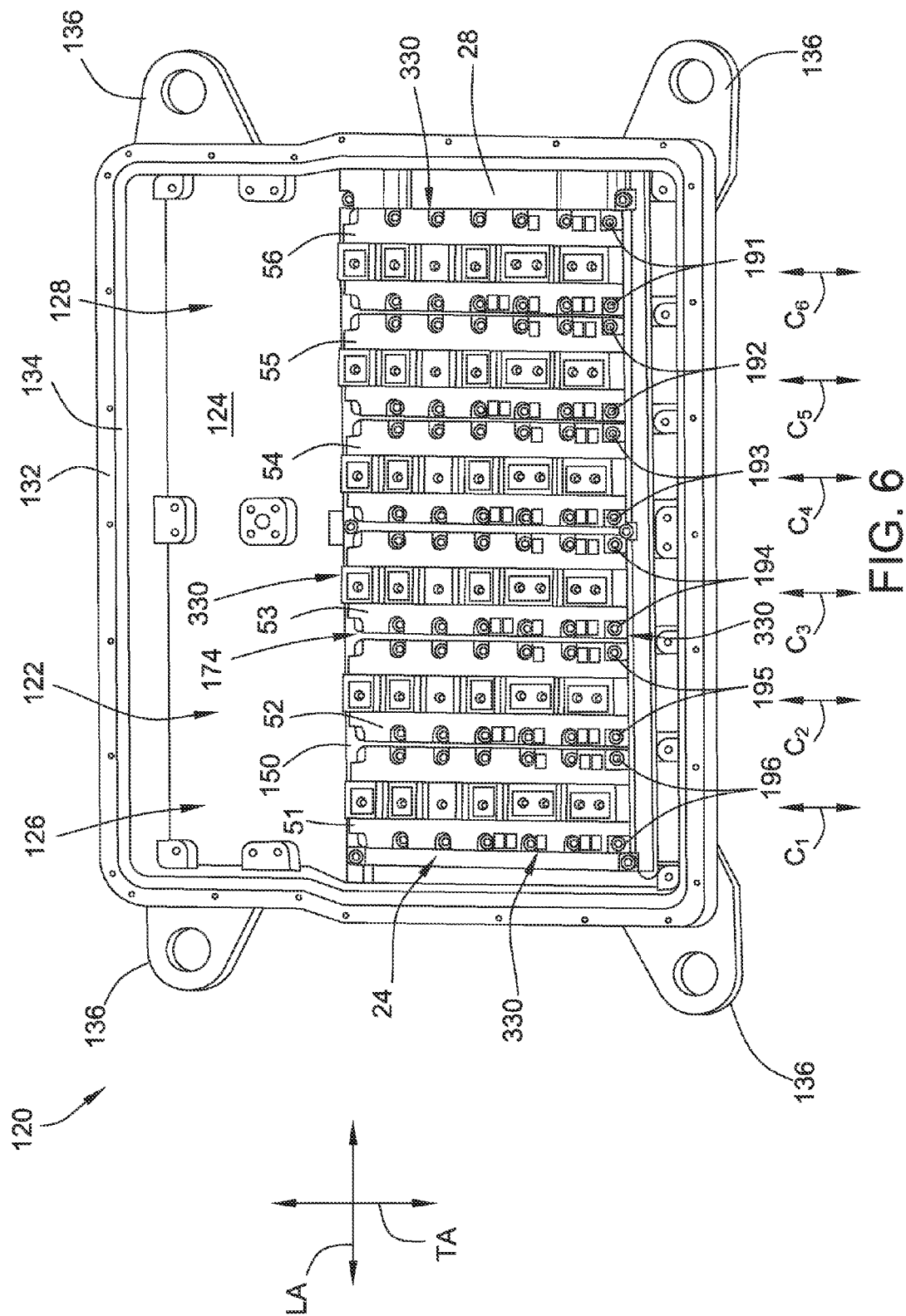
FIG. 6 is a top perspective view of an embodiment of an assembly for a power converter constructed according to principles of the present disclosure.

Referring to FIG. 6, an embodiment of a power converter housing 120 is shown. In embodiments, the power converter housing 120 comprises a cast metallic housing formed, for example, from a relatively highly heat conductive material such as, aluminum, for example. The power converter housing 120 can be configured to receive a liquid-cooled heat sink constructed according to principles of the present disclosure, such as the one found in the assembly 20.

The power converter housing 120 can define an interior cavity 122 therein which can accommodate the power module subassembly 24 and the heat sink 28. An inner surface 124 of the power converter housing 120 can serve as a support mechanism for supporting, in addition, or alternatively, to the DC bus bar 70, the capacitor subassembly 22 in the first packaging arrangement, the supporting power module subassembly 24 in the second packaging arrangement, and the heat sink 28.

In embodiments, the power converter housing 120 comprises a monolithic, single piece cast molding made from aluminum, such as, 356-T6 aluminum, for example, where the inner surface 124 is molded in a manner which corresponds with the first packaging configuration of the capacitor subassembly 22 and also corresponds with the outer surface of the heat sink 28 such that the heat sink 28 can be placed therein with the power module subassembly 24 mounted to it. The illustrated interior cavity 122 can include first and second capacitor wells 126, 128 which are defined by the inner surface 124. The first and second capacitor wells 126, 128 are configured to accommodate therein the first and second capacitor units 32, 34 of the capacitor subassembly 22, respectively. In embodiments, the capacitor subassembly 22 can be positioned within the power converter housing 120 such that surfaces of the first and second capacitor units 32, 34 are in heat transferring relationship with the inner surface 124 of the power converter housing 120.

The power converter housing 120 can be used to fluidly seal the electronics assembly 20 therein via a power converter housing cover (not shown). In embodiments, a cover can be mounted to the power converter housing 120 which is adapted to fluidly seal the electronics assembly 20 in the housing 120 for protection from dirt, debris, mechanical damage, water, etc. In embodiments, the cover can be made from the same material as the housing 120, such as 356-T6 aluminum, for example, and can also be made using any suitable technique known to those skilled in the art, such as by being sand cast, for example. In other embodiments, other materials and other manufacturing methods may be used.

In embodiments, the cover 190 can be bolted to housing 120. A perimeter 132 of the power converter housing 120 can define a sealing channel 134 therein which is adapted to receive a suitable power converter housing cover to present a substantially flush upper face. An o-ring seal, gasket, or other seal (not shown) may be placed within the sealing channel 134 to fluidly seal the cover to the power converter housing 120. In embodiments, the housing cover can comprise a substantially planar panel with a series of mounting holes therethrough which are disposed around the perimeter of the panel.

The power converter housing 120 includes a plurality of mounting tabs 136 which are configured to secure the power converter housing 120 to a substrate or other suitable mounting surface of a machine. In embodiments, the power converter housing 120 can be used in a machine comprising a track-type tractor. In embodiments, the power converter housing 120 can be mounted to a light fabrication structure such as the fuel tank, positioned behind and below the operator cabin to protect the assembly from the external environment in which the machine may be located. In the illustrated embodiment, the power converter housing 120 includes four mounting tabs 136. In other embodiments, a different number of mounting tabs can be used and/or different mounting structure can be provided as will be appreciated by one skilled in the art.

Figure 7:
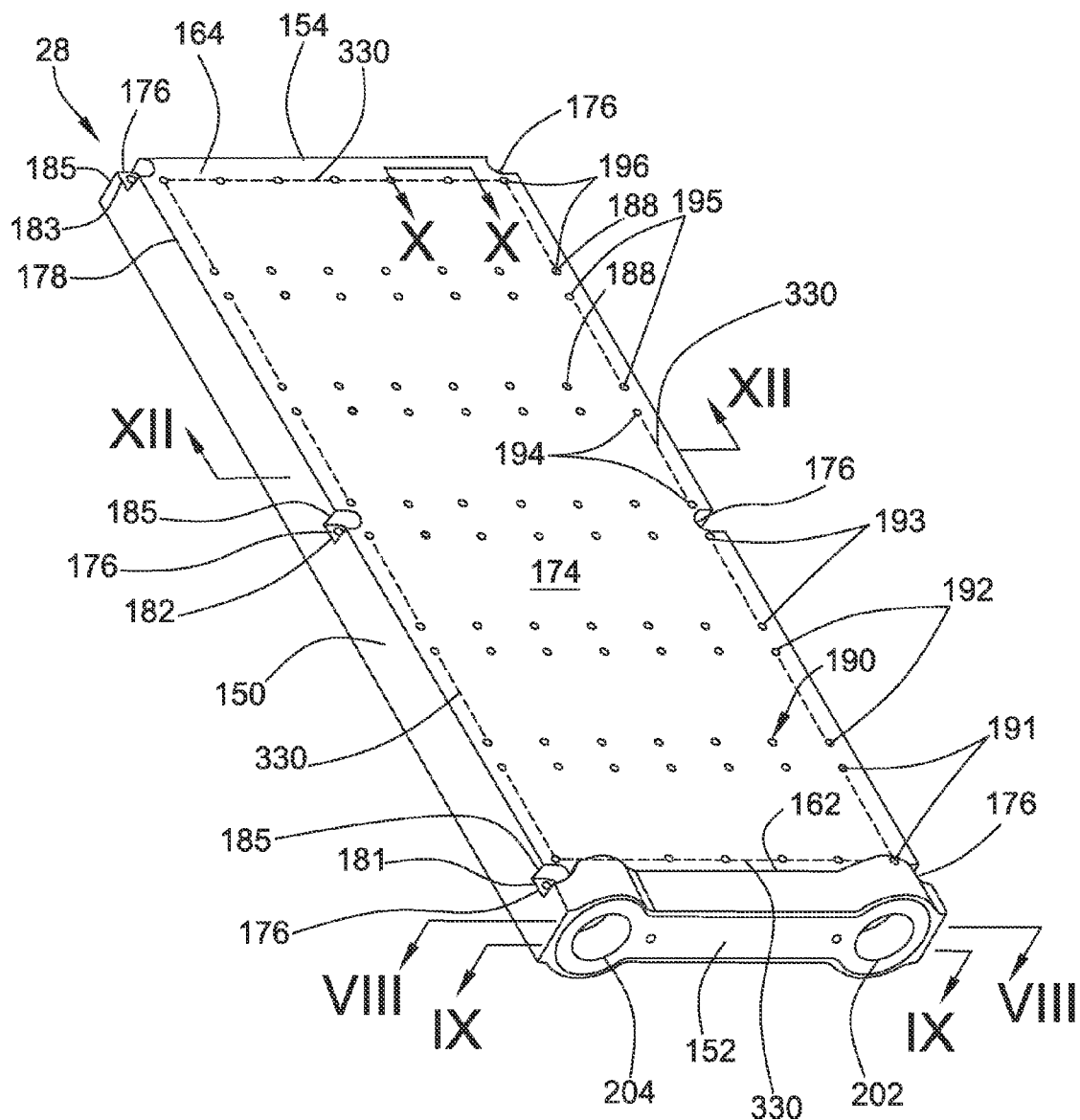
FIG. 7 is a perspective view, from the top, of an embodiment of a heat sink constructed according to principles of the present disclosure.
Figure 7:
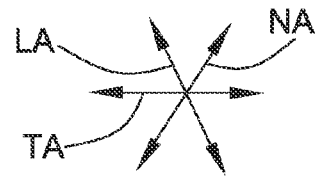

Referring to FIG. 7, the heat sink 28 includes a body 150, a fitting end cap 152, and a return end cap 154. The heat sink 28 can be made by any suitable manufacturing technique. In embodiments, the heat sink 28 can be made by extruding the body 150 from a material with suitable heat conducting properties, such as, aluminum, for example and by welding the fitting end cap 152 and the return end cap 154 thereto. In embodiments, the fitting end cap 152 and the return end cap 154 can be welded to the body 150 using friction stir welding (FSW) or other suitable means.

Figure 8:
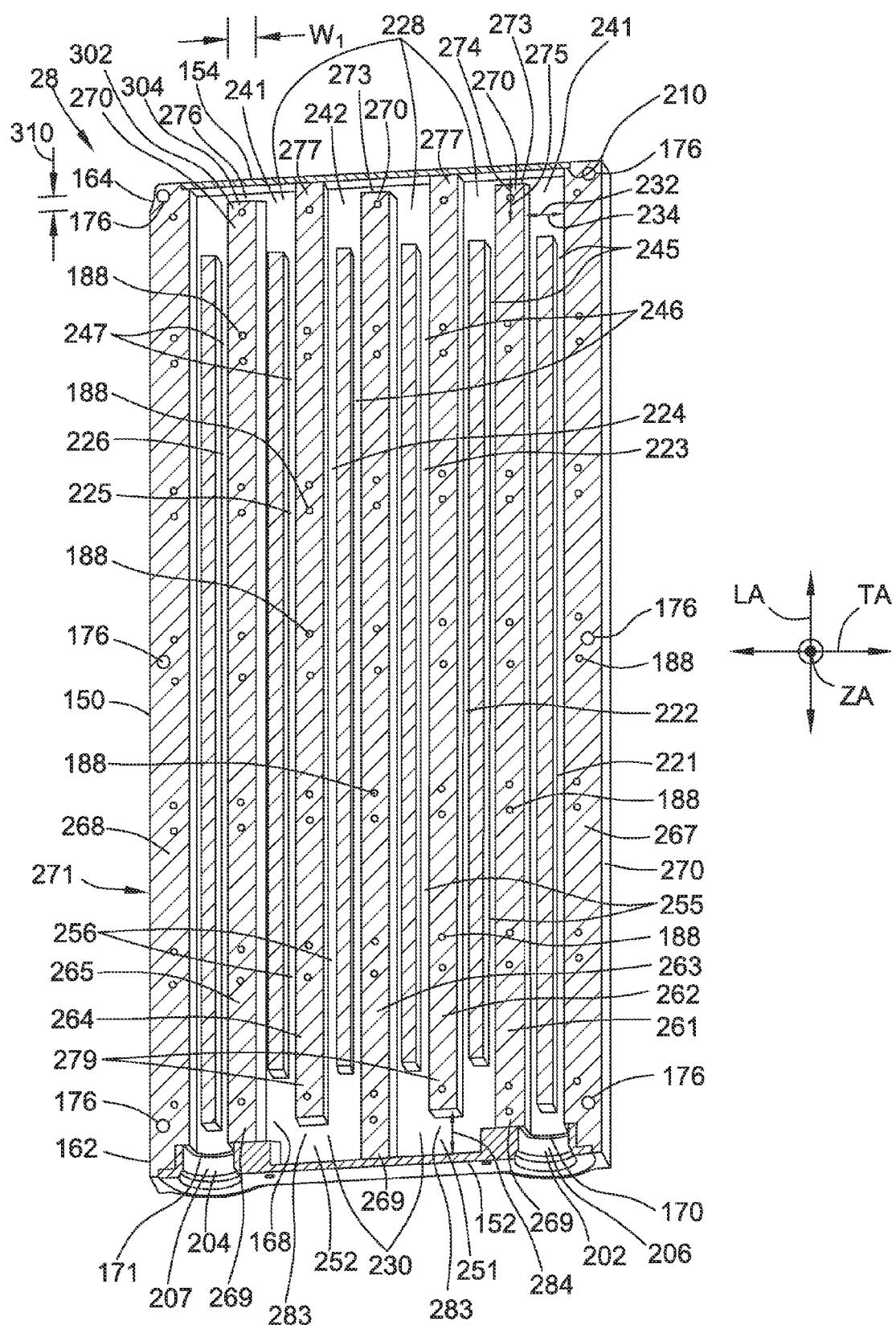
FIG. 8 is a cross-sectional view taken along line VIII-VIII in FIG. 7 of the heat sink of FIG. 7.

Referring to FIGS. 7 and 8, the body 150 includes a fitting end 162 and a return end 164 in opposing relationship to the fitting end 162. A serpentine fluid passage 168 is defined inside the body 150. The serpentine fluid passage 168 has a passage inlet 170 and a passage outlet 171 both disposed at the fitting end 162.

Referring to FIG. 7, the body includes a heat transfer face 174 extending along a longitudinal axis "LA" between the fitting end 162 and the return end 164. The heat transfer face 174 is substantially planar and is substantially parallel to a plane defined by the longitudinal axis "LA" and a transverse or lateral axis "TA," which is perpendicular to the longitudinal axis "LA." The heat transfer face 174 is disposed in heat transferring relationship with the serpentine fluid passage 168 inside the body 150. The heat transfer face 174 can be cooled via conduction by coolant fluid circulating through the serpentine fluid passage 168 inside the body 150 as part of a cooling circuit of a coolant fluid circulation system.

In embodiments, the heat transfer face 174 can be configured to contact each heat dissipation surface 60 of each of the power modules 51-56 of the power module subassembly 24. In embodiments, a suitable thermal grease or the like may be used to coat surfaces of the heat sink 28 which contact components of the electronics assembly 20 to facilitate the heat transferring relationship therebetween.

The body 150 of the heat sink 28 can define a plurality of heat sink mounting holes 176 configured for securing the heat sink 28 to a supporting substrate, such as the power converter housing 120, for example. The illustrated heat sink 28 includes six heat sink mounting holes 176 disposed around a perimeter 178 of the body 150 in an array of three pairs 181, 182, 183 of opposing heat sink mounting holes 176. In other embodiments, a different configuration can be used for the heat sink mounting holes 176.

In the illustrated embodiment, the heat sink mounting holes 176 extend along a normal axis "NA," which is perpendicular to both the longitudinal axis "LA" and the lateral axis "TA," through the body 150. Each mounting hole is located in a recessed shoulder 185 which can be configured to accommodate a fastener head therein such that the fastener is disposed in offset, non-interfering relationship with the heat transfer face 174 along the normal axis "NA."

The body 150 of the heat sink 28 also defines a plurality of power module mounting holes 188 therein. The power module mounting holes 188 are disposed in an array 190 which is configured to allow the power modules 51-56 to be secured to the body 150 of the heat sink 28 such that the power modules 51-56 are in heat transferring relationship with the heat transfer face 174 of the body 150. The illustrated heat sink 28 includes an array 190 of power module mounting holes 188 having twelve columns of power module mounting holes 188 extending along the lateral axis "TA" of the heat sink 28 which are arranged in six pairs 191-196 of columns. With such a configuration, six power modules 51-56 can be mounted to the heat transfer face 174 of the heat sink 28 with the principal module axis $C_1$-$C_6$ of each power module 51-56 being substantially perpendicular to the longitudinal axis "LA," and substantially parallel with the lateral axis "TA," of the heat sink 28 (see FIG. 6).

Referring to FIG. 7, the fitting end cap 152 is connected to the fitting end 162 of the body 150. The fitting end cap 152 can be made, and connected to the body 150, by any suitable technique known to those skilled in the art, such as, by being made from wrought metal and welded to the body, for example.

Referring to FIGS. 7 and 8, the fitting end cap 152 defines a fluid inlet 202 and a fluid outlet 204 respectively in fluid communication with the passage inlet 170 and the passage outlet 171 of the serpentine fluid passage 168. It should be understood that the terms "inlet" and "outlet" are for convenient reference only inasmuch as the coolant fluid can be circulated through the body 150 in either direction in different embodiments.

Figure 13:
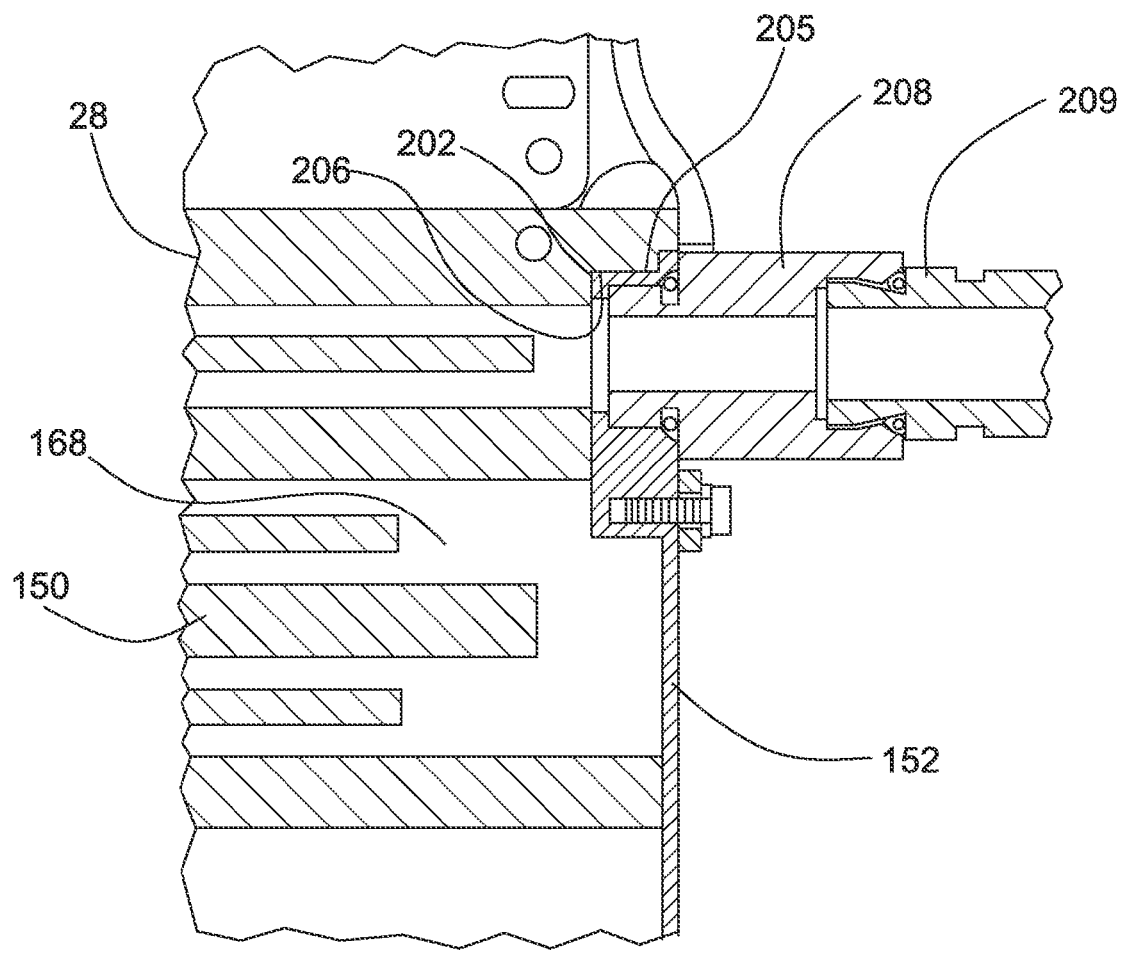
FIG. 13 is an enlarged, detail view taken in longitudinal section of a fluid inlet port of the heat sink of FIG. 7, illustrating a coolant line connected thereto.

Referring to FIG. 8, the illustrated fluid inlet 202 and fluid outlet 204 include an internal threaded surface 206, 207, which is adapted to threadingly engage an external threaded surface of a fluid inlet fitting and a fluid outlet fitting, respectively. Referring to FIG. 13, the fluid inlet 202 of the fitting end cap 152 can be adapted to retentively engage a fluid inlet fitting 208 of a coolant feed line 209 which includes an external threaded surface 205. The coolant feed line 209 can be configured to convey liquid coolant from a pump of a circulation system to circulate the coolant through the serpentine fluid passage 168 inside the body 150 of the heat sink 28. In a similar manner, the fluid outlet 204 of the fitting end cap 152 can be adapted to retentively engage a fluid outlet fitting of a coolant return line (not shown) which is configured to convey coolant discharging from the serpentine fluid passage 168 of the body 150 out of the heat sink 28 to return the coolant to a radiator, or the like, of the coolant fluid circulation system.

Referring to FIG. 8, the return end cap 154 is connected to the return end 164 of the body 150. The return end cap 154 can be made, and connected to the body 150, by any suitable technique known to those skilled in the art, such as, by being made from wrought metal and welded to the body 150, for example.

The illustrated return end cap 154 is in the form of a generally planar blank panel which is secured to the return end 164 of the body 150 by FSW techniques or other suitable methods. The return end 164 of the body 150 includes a recessed mounting channel 210 which is configured to accept the return end cap 154 therein to present a substantially flush appearance at the return end 164 once the return end cap 154 is welded thereto.

Referring to FIG. 8, between the passage inlet 170 and the passage outlet 171 disposed at the fitting end 162 of the body 150, the serpentine fluid passage 168 includes a plurality of longitudinal passage segments 221-226 extending along the longitudinal axis "LA," a return end turn area 228, and a fitting end turn area 230. The plurality of longitudinal passage segments 221-226 is in fluid communication with each adjacent longitudinal passage segment alternatingly through the return end turn area 228 and the fitting end turn area 230.

The illustrated heat sink 28 includes six longitudinal passage segments 221-226. In other embodiments, the number of longitudinal passage segments 221-226 can be varied. In embodiments, the serpentine fluid passage 168 includes at least one pair of longitudinal passage segments 221,222 and the return end turn area 228. The pair of longitudinal passage segments 221, 222 can be in fluid communication with each other through the return end turn area 228.

Each of the longitudinal passage segments 221-226 has a longitudinal fluid flow cross-sectional area 232 in a plane 234 generally perpendicular to a flow of fluid through the respective longitudinal passage segment.

In the illustrated embodiment, the flow of fluid through each longitudinal passage segment 221-226 is substantially parallel with the longitudinal axis "LA" of the heat sink 28. The plane 234 in which the longitudinal fluid flow cross-sectional area 232 is measured is substantially parallel with the plane defined by the lateral axis "TA" and the normal axis "NA" of the heat sink 28.

The illustrated return end turn area 228 includes three return end turn chambers 241, 242, 243. Each return end turn chamber 241, 242, 243 is in fluid communication with a pair of adjacent longitudinal passage segments 221-226. In the illustrated embodiment, the first return end turn chamber 241 is in fluid communication with a first pair 245 of adjacent longitudinal passage segments 221, 222; the second return end turn chamber 242 is in fluid communication with a second pair 246 of adjacent longitudinal passage segments 223, 224; and the third return end turn chamber 243 is in fluid communication with a third pair 247 of adjacent longitudinal passage segments 225, 226.

The illustrated fitting end turn area 228 includes two fitting end turn chambers 251, 252. Each fitting end turn chamber 251, 252 is in fluid communication with an intermediate pair of adjacent longitudinal passage segments 222-225. In the illustrated embodiment, the first fitting end turn chamber 251 is in fluid communication with a first intermediate pair 255 comprising the second and third longitudinal passage segments 222, 223; and the second fitting end turn chamber 252 is in fluid communication with a second intermediate pair 256 comprising the fourth and fifth longitudinal passage segments 224, 225.

To define the serpentine fluid passage 168, the body 150 includes a divider web 261-265 interposed between each pair 245-247, 255, 256 of adjacent longitudinal passage segments 221-226. The body 150 also includes a pair of lateral side walls 267, 268 disposed at a respective side 270, 271 of the body 150. In the illustrated embodiment, the divider webs 261-265 and the lateral side walls 267, 268 cooperate with the fitting end cap 152 and the return end cap 154 to define the serpentine fluid passage 168.

The lateral side walls 267, 268 can include the heat sink mounting holes 176 therein. The divider webs 261-265 can be configured such that each divider web 261-265 has a divider web width $W_1$, measured along the lateral axis "TA," which is sufficient to accommodate at least one of the power module mounting holes 188 therein. In embodiments, at least one of the plurality of power module mounting holes 188 can extend at least partially into at least one of the divider webs 261-265. The divider webs 261-265 can provide for sufficient material so that the power modules 51-56 can be mounted directly to heat transfer face 174, thereby increasing the heat transfer rate from the electronics assembly 20 to the coolant circulating through the serpentine fluid passage 168 inside the body 150 of the heat sink 28. In the illustrated heat sink 28, each of the power module mounting holes 188 extends into a respective one of the divider webs 261-265.

In embodiments, at least one of the divider webs 261-265 of the body 150 defines at least one power module mounting hole 188 therein which is adapted to receive a mounting fastener for securing a power module 51-56 to the body 150 such that the power module 51-56 is in heat transferring relationship with the heat transfer face 174 of the body 150. In embodiments, at least one of the plurality of power modules 51-56 is mounted to the heat sink 28 via a mounting fastener secured in the power module mounting hole 188 which is disposed within one of the divider webs 261-265.

The illustrated embodiment of the heat sink 28 includes three fitting end divider webs 261, 263, 265 and two return end divider webs 262, 264 disposed in alternating relationship with respect to each other. Each divider web 261-265 has a generally rectangular cross-sectional shape in a plane defined by the lateral axis "TA" and the normal axis "NA." Each fitting end divider web 261, 263, 265 includes a mounting portion 269 and a restrictor portion 270 in opposing relationship thereto. The mounting portion 269 of each fitting end divider web 261, 263, 265 is disposed adjacent the fitting end 162 of the body 150 and is configured to be in contacting relationship with the fitting end cap 152 when it is secured to the body 150 to provide a sealed connection therebetween. The restrictor portion 270 of each fitting end divider web 261, 263, 265 is disposed adjacent the return end 164 of the body 150 and is configured to be in spaced relationship to the return end cap 154 to define a restricted orifice 273 therebetween with a return end fluid flow cross-sectional area 274 in a plane 275 generally perpendicular to the flow of fluid through the return end turn area 228 at the restrictor portion 270.

In the illustrated embodiment, the flow of fluid through each restricted orifice 273 in the return end area 228 is substantially parallel with the lateral axis "TA" of the heat sink 28. The longitudinal fluid flow cross-sectional area 232 is measured in a plane 275 which is substantially parallel with the plane defined by the longitudinal axis "LA" and the normal axis "NA" of the heat sink 28.

In embodiments, at least one divider web 261, 263, 265 has a restrictor portion 270 disposed in the return end turn area 228 disposed in spaced relationship to the return end cap 154 to define a restricted orifice 273 therebetween. In the illustrated embodiment, each fitting end divider web 261, 263, 265 has a restrictor portion 269 disposed in the return end turn area 228.

Each return end divider web 262, 264 includes a mounting portion 277 and a restrictor portion 279 in opposing relationship thereto. The mounting portion 277 of each return end divider web 262, 264 is disposed adjacent the return end 164 of the body 150 and is configured to be in contacting relationship with the return end cap 254 when it is secured to the body 150 to provide a sealed connection therebetween. The restrictor portion 279 of each return end divider web 262, 264 is disposed adjacent the fitting end 162 of the body 150 and is configured to be in spaced relationship to the fitting end cap 152 to define a restricted orifice 283 therebetween with a fitting end fluid flow cross-sectional area 284.

In embodiments, the longitudinal passage segments 221-226 and the divider webs 261-265 can be configured such that the flow path of the coolant through the serpentine fluid passage 168 avoids abrupt geometry changes which can induce pressure drops that negatively affect the flow of the coolant. In embodiments, each longitudinal fluid flow cross-sectional area 232 defined by the longitudinal passage segment 221-225 is substantially the same. In embodiments, each return end fluid flow cross-sectional area 274 defined by each of the fitting end divider webs 261, 263, 265 is substantially the same. In embodiments, each longitudinal fluid flow cross-sectional area 232 defined by the longitudinal passage segment 221-225 is substantially the same. In embodiments, each fitting end fluid flow cross-sectional area 284 defined by each of the return end divider webs 262, 264 is substantially the same.

In embodiments, the return end fluid flow cross-sectional area 274 defined by each of the fitting end dividers 261, 263, 265 is substantially the same as the longitudinal fluid flow cross-sectional area 232 defined by the longitudinal passage segment 221, 223, 225 immediately upstream thereof in the direction of flow of coolant through the serpentine fluid passage 168. In embodiments, a ratio of the return end fluid flow cross-sectional area 274 to the longitudinal fluid flow cross-sectional area 232 is in a range between about 9:10 and about 5:4, in a range between about 1 and about 5:4 in other embodiments, and in a range between about 1 and about 6:5 in still other embodiments. In embodiments, the return end fluid flow cross-sectional area 274 is substantially the same as the longitudinal fluid flow cross-sectional area 232.

Figure 9:
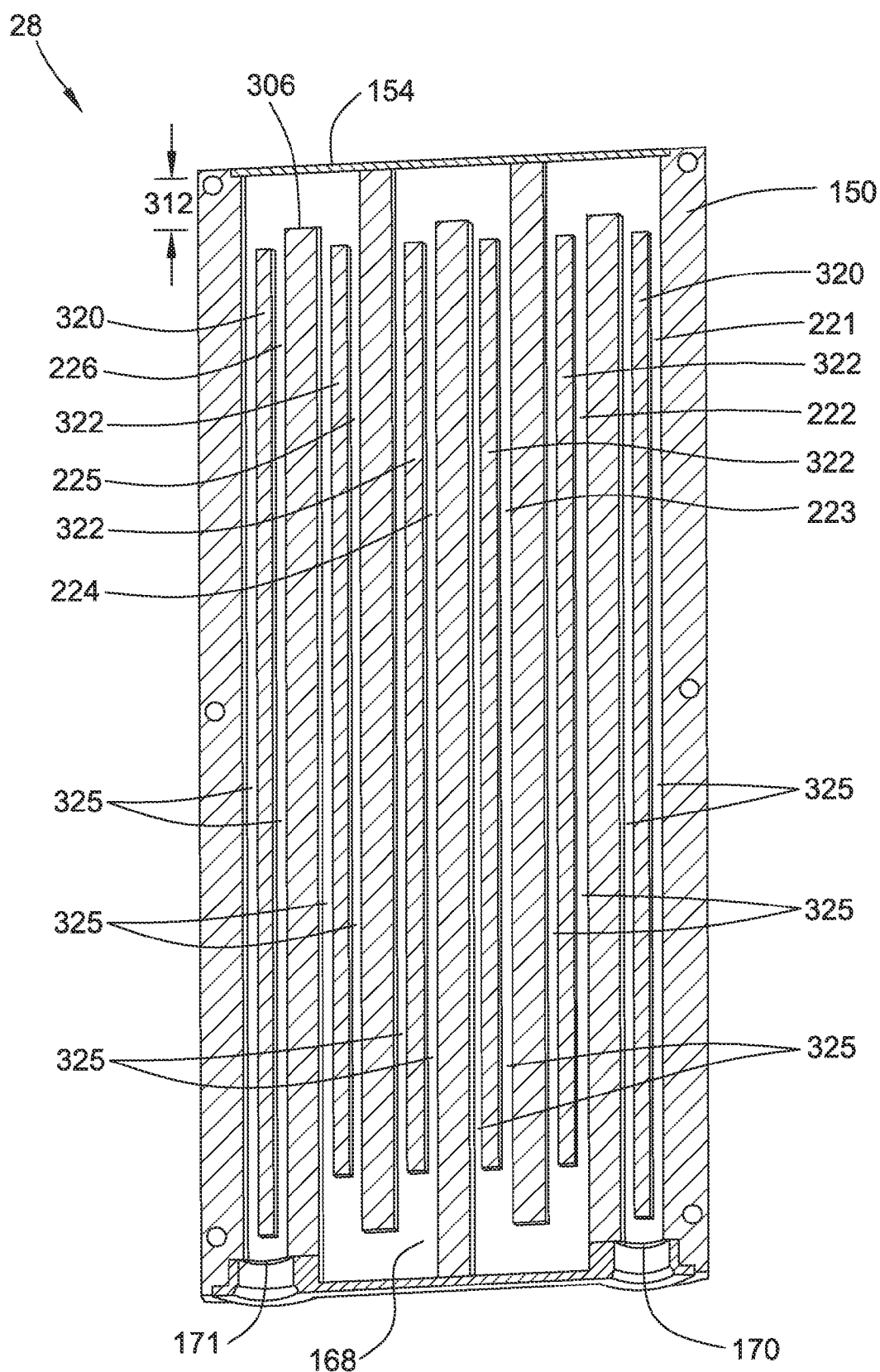
FIG. 9 is a cross-sectional view taken along line IX-IX in FIG. 7 of the heat sink of FIG. 7, which is at a lower elevation than that in FIG. 8 to illustrate the notched ends of the return end divider webs.
Figure 10:
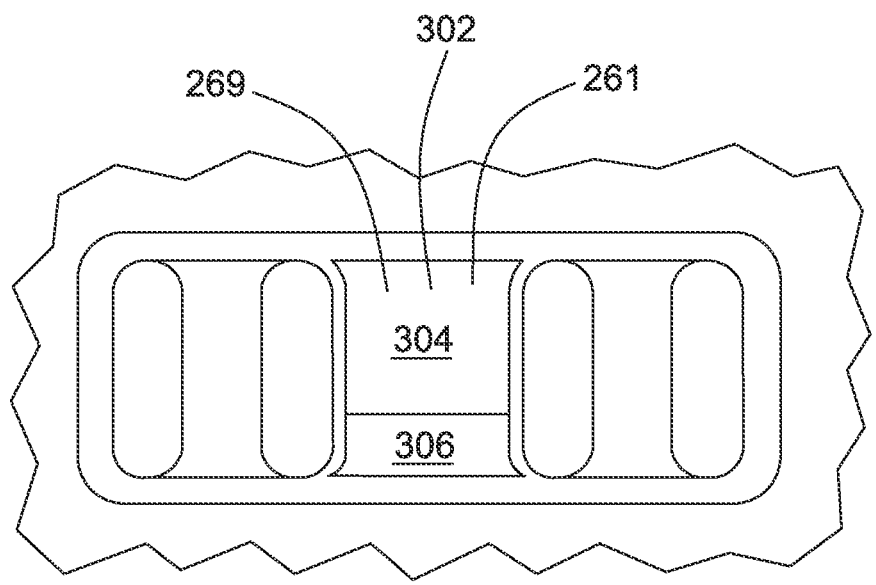
FIG. 10 is an enlarged, cross-sectional detail view, as indicated by line X-X in FIG. 7, of a portion of a return end turn area of the heat sink device of FIG. 7, illustrating a notched end of a return end divider web.
Figure 11:
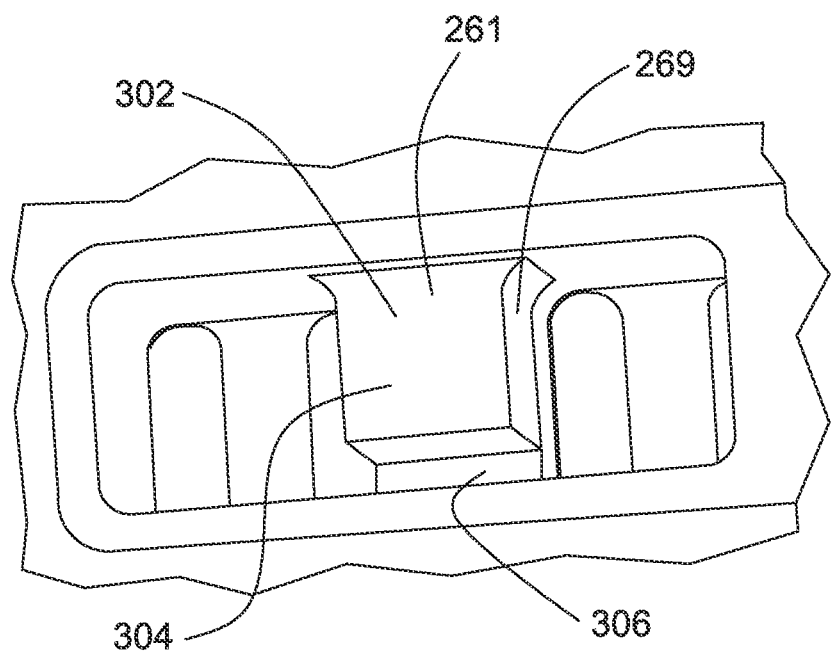
FIG. 11 is a view similar to FIG. 10, but in perspective.

Referring to FIGS. 8-11, the restrictor portion 269 of each of the fitting end divider webs 261, 263, 265 has a notched end 302 with a heat transfer portion 304 and a base portion 306 (see FIGS. 9-11) in recessed relationship to the heat transfer portion 304. The heat transfer portion 304 of the notched end 302 is in proximate relationship to the heat transfer face 174 relative to the base portion 306. Referring to FIG. 8, the heat transfer portion 304 has a first clearance distance 310, measured along the longitudinal axis "LA," to the return end cap 154. Referring to FIG. 9, the base portion 306 has a second clearance distance 312, measured along the longitudinal axis "LA," which is greater than the first clearance distance 310 of the heat transfer portion 304.

Referring to FIG. 9, the serpentine fluid passage 130 can be equipped with a plurality of secondary dividers or fins 320, 322 which partition flow. The fins 320, 322 can provide an increased surface area for the serpentine fluid passage 168 to yield increased heat transfer from the heat transfer face 118 to the coolant circulating through the serpentine fluid passage 168. Each fin 320, 322 bifurcates the respective longitudinal passage segment 221-226 in which the fin 320, 322 is disposed into a pair of fluid channels 325. In embodiments, the respective fluid channels 325 defined by each fin 320, 322 are substantially the same as each other.

In embodiments, the body 150 includes a fin 320, 322 disposed in at least one of the plurality of longitudinal passage segments 221-226. The illustrated body 150 includes a fin 320, 322 disposed in each of the longitudinal passage segments 221-226. The outer fins 320 disposed in the first and the sixth longitudinal passage segment 221, 226 are longer than the inner fins 322 so that the outer fins 320 come into close proximity with the passage inlet 170 and the passage outlet 171.

In embodiments, the serpentine fluid passage 168 can be configured to allow for a high flow of coolant therethrough with low pressure drop. In embodiments, the profile of the fluid channels 325 of the serpentine fluid passage 168 defined inside the body 150 of the heat sink 28 can be configured to maintain the pressure drop from the passage inlet 170 to the passage outlet 171 of the heat sink 28 to an acceptable level while providing a desired thermal conductivity performance.

Figure 12:
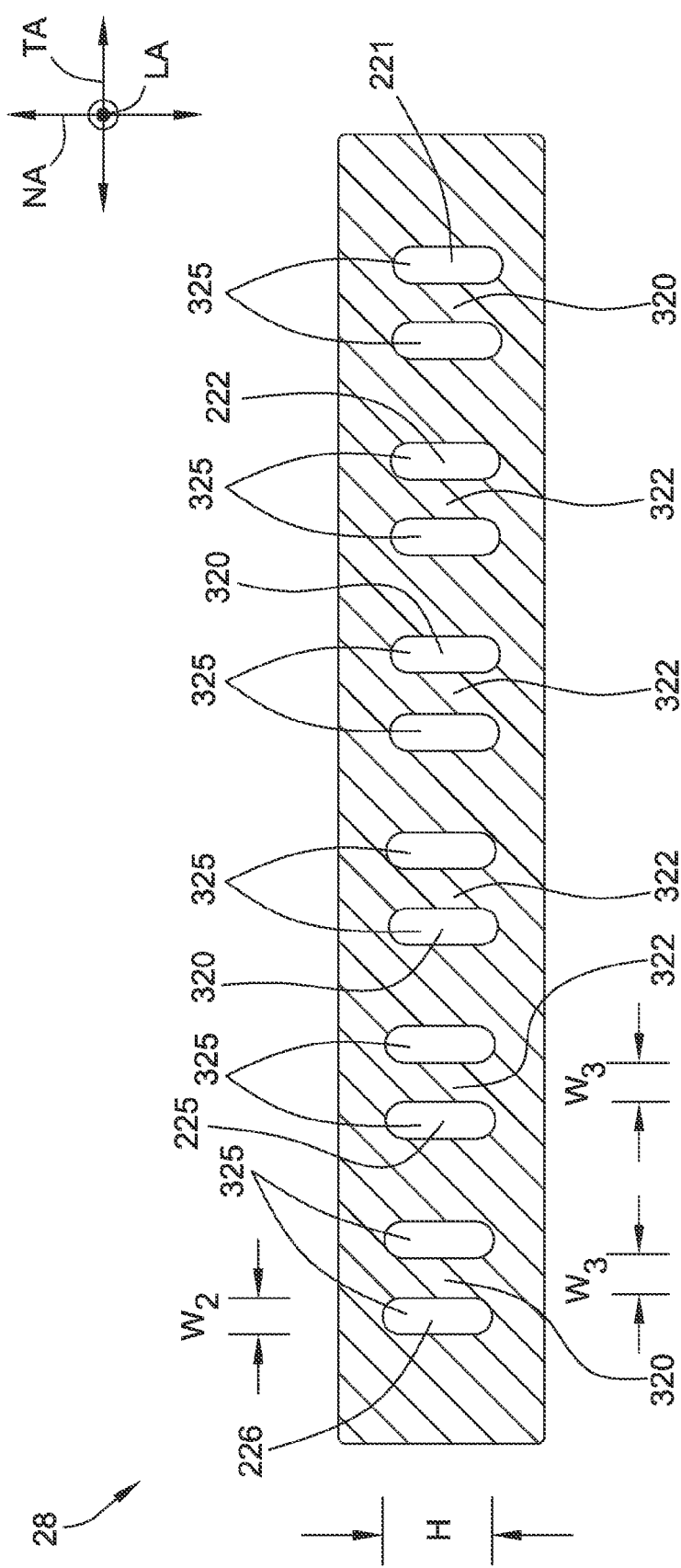
FIG. 12 is a transverse cross-sectional view of a body of the heat sink of FIG. 7 taken along line XII-XII in FIG. 7 of the heat sink of FIG. 7.

Referring to FIG. 12, each fluid channel can have a channel width $W_2$, measured along the lateral axis "TA" perpendicular to the longitudinal axis "LA," and a channel height H, measured along the normal axis "NA" perpendicular to both the longitudinal axis "LA" and the lateral axis "TA." In embodiments, a ratio of the channel width $W_2$ to the channel height H is in a range between about 1:5 and about 1:1. In still other embodiments, the ratio of the channel width $W_2$ to the channel height H is in a range between about 1:5 and about 3:4, and in a range between about 1:5 and about 1:2 in yet other embodiments. In the illustrated heat sink 28, each fluid channel is substantially the same, the ratio of the channel width to the channel height being about 1:3.

In embodiments, each fin 320, 322 has a fin width $W_3$, measured along the lateral axis "TA." In embodiments, a ratio of: (i) the channel width $W_2$ of each of the pair of fluid channels 325 of the respective longitudinal passage segment 221-226 in which the fin 320, 322 is disposed to (ii) the fin width $W_3$ of that fin 320, 322, is in a range between about 3:4 and about 5:4, in a range between about 3:4 to about 9:8 in still other embodiments, and in a range between about 7:8 and about 5:5 in still other embodiments.

In the illustrated heat sink 28, each fin 320, 322 has substantially the same fin width $W_3$. The illustrated ratio of the channel width $W_2$ of each of the pair of fluid channels 325 of the respective longitudinal passage segment 221-226 in which the fin 320, 322 is disposed to the fin width $W_3$ of that fin 320, 322 is about 7:8.

Referring back to FIG. 6, the plurality of power modules 51-56 is mounted to the heat transfer face 174 of the body 150. Each principal axis "$C_1$-$C_6$" of the power modules 51-56 is in transverse relationship to the longitudinal axis "LA" of the heat sink 28. In particular, the principal axis "$C_1$-$C_6$" of each power modules 51-56 is substantially parallel to the lateral axis "TA," and substantially perpendicular to the longitudinal axis "LA," of the heat sink 28.

The plurality of power modules 51-56 can be mounted to the heat sink 28 such that they are in abutting relationship to each other with the power modules 51-56 defining a power module footprint 330 defined by their extreme outer perimeters. The power module footprint 330 is also shown approximately in FIG. 7 by the dashed rectangle outlining the outer perimeter of the power module mounting holes 188 defined in the body 150 of the heat sink 28. In embodiments, at least portions of the fitting end turn area 230 and the opposing return end turn area 228 of the heat sink 28 are disposed within the power module footprint 330.

Figure 14:
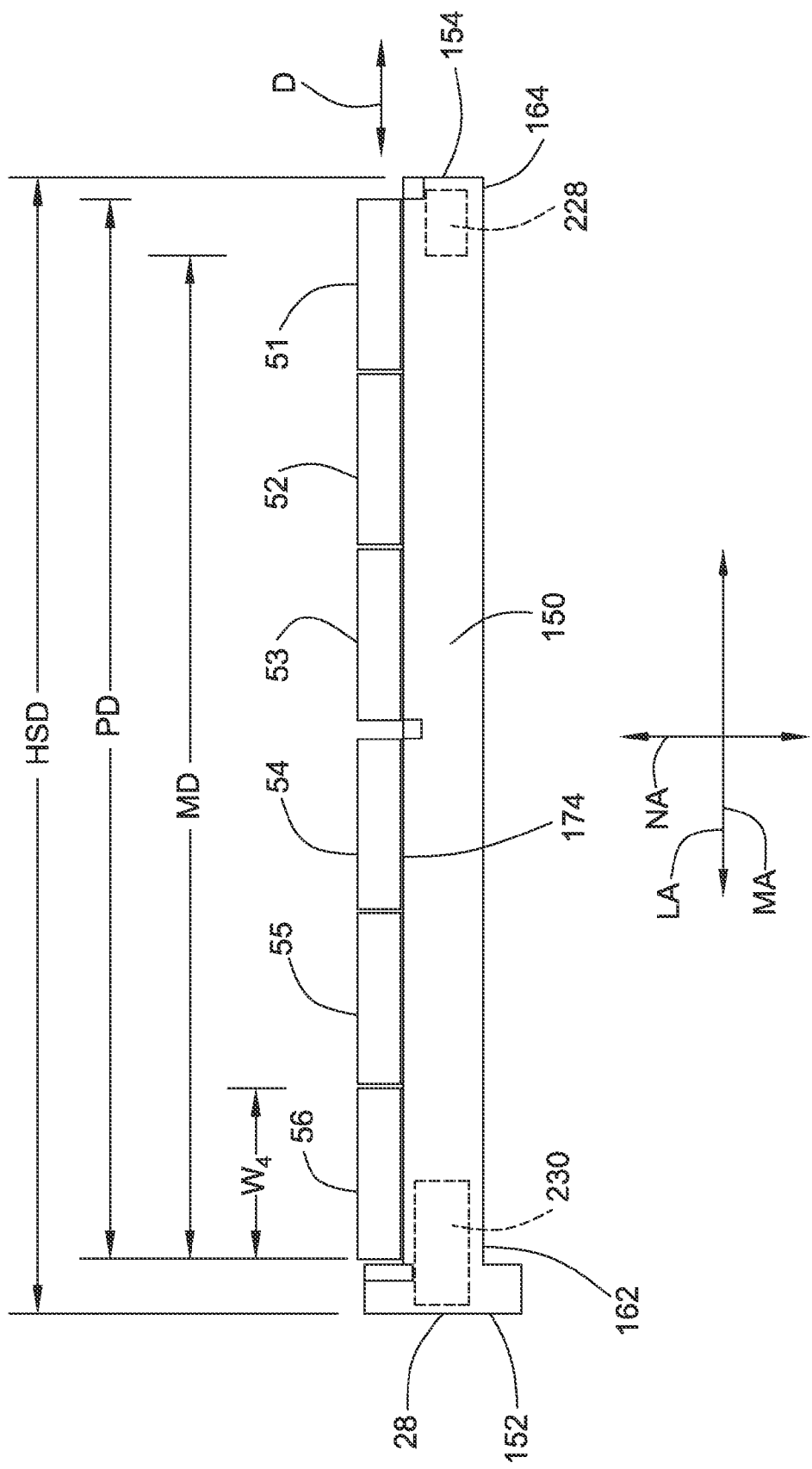
FIG. 14 is a side elevational view of the heat sink of FIG. 7 with a plurality of power modules mounted thereto.

Referring to FIG. 14, in embodiments, the plurality of power modules 51-56 is mounted to the heat transfer face 174 of the body 150 of the heat sink 28 in abutting, spaced relationship to each other over a packing distance "PD" along a power module mounting axis "MA" with a power module packing factor "PF" equal to at least about 0.85. The power module packing factor "PF" is calculated as:

$$PF = 1 - \frac{\text{(packing distance} - \text{module distance)}}{\text{module distance}},$$

where the module distance "MD" is a distance along the power module mounting axis "MA" the plurality of power modules 51-56 would span if disposed in contacting relationship to each other, and the packing distance "PD" is a distance along the power module mounting axis "MA" which the plurality of power modules 51-56 actually spans. In still other embodiments, the plurality of power modules 51-56 can be mounted in abutting, spaced relationship to each other over the packing distance "PD" along the power module mounting axis "MA" with a power module packing factor "PF" equal to at least about 0.9, and at least about 0.95 in still other embodiments. In the illustrated embodiment of FIG. 6, the power modules 51-56 are mounted to the heat sink 28 with a power module packing factor "PF" of 0.96.

Referring to FIG. 14, in embodiments, the plurality of power modules 51-56 is mounted to the heat transfer face 174 of the body 150 of the heat sink 28 in abutting, spaced relationship to each other along a power module mounting axis "MA" with a power module density factor "DF" equal to at least about 0.85. The power module density factor "DF" is calculated as:

$$DF = 1 - \frac{(\text{heat sink distance} - \text{module distance})}{\text{module distance}},$$

where the heat sink distance "HSD" is a distance along the module mounting axis "MA" over which the heat sink 28 extends, and the module distance "MD" is a distance along the power module mounting axis "MA" the plurality of power modules 51-56 would span if disposed in contacting relationship to each other. In the illustrated embodiment of FIG. 14, the power modules 51-56 are mounted to the heat sink 28 with a power module density factor "DF" of 0.87.

Referring to FIG. 14, in the illustrated embodiment, the power modules 51-56 are in abutting, spaced relationship with each other along their transverse module axis "D," which is substantially aligned with the longitudinal axis "LA" of the heat sink 28. Thus, the illustrated power module mounting axis "MA" is substantially parallel with the longitudinal axis "LA" of the heat sink 28.

In embodiments, at least a portion of the return end turn area 228 and the fitting end turn area 230 of the heat sink 28 are disposed within the packing distance "PD" of the plurality of power modules 51-56. In embodiments, a fitting end power module 56, which is the one of the power modules 51-56 that is in closest relationship to the fitting end 162 of the heat sink 28, and a return end power module 51, which is the one of the plurality of power modules 51-56 that is in closest relationship to the return end 164 of the heat sink 28, are in respective overlaying relationship with the fitting end turn area 230 and the return end turn area 228 of the heat sink 28, as illustrated in FIG. 14, for example.

In embodiments, the longitudinal passage segments 221-226, the divider webs 261-265, and/or the array 190 of power module mounting holes 188 can be configured such that the flow path of the coolant through the serpentine fluid passage 168 is in substantial underlying relationship with each die of the power modules 51-56 mounted to the heat sink 28. In embodiments, the longitudinal passage segments 221-226 are in spaced relationship to each other and have a corresponding number such that each die of the power modules 51-56 mounted to the heat sink 28 is directly over a portion of at least one longitudinal passage segments 221-226.

Figure 15:
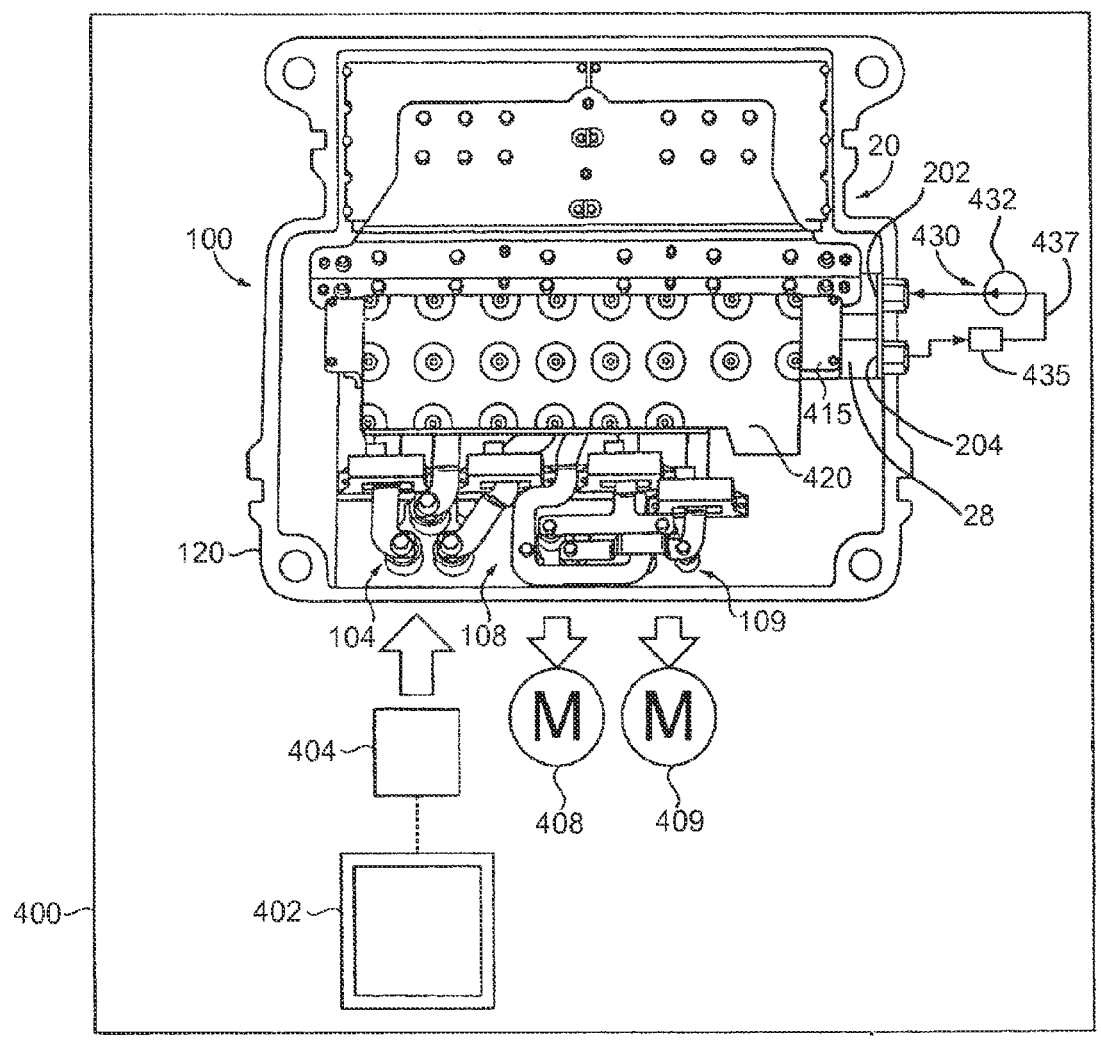
FIG. 15 is a diagrammatic view of an embodiment of a machine having an electric propulsion system following principles of the present disclosure.

Referring to FIG. 15, there is shown an embodiment of a machine 400 which includes a combustion engine, such as, an internal combustion engine 402, for example, coupled with and adapted to power an electrical generator 404. The electrical generator 404 can include a three-phase electrical generator which can be adapted to supply electrical power to the AC input interface 104 in any suitable manner known to those skilled in the art. The machine 400 can include one or more electric propulsion motors. In embodiments, the machine 400 includes a first electric propulsion motor 408 coupled with the first AC output interface 108 and a second electric propulsion motor 409 coupled with the second AC output interface 109. In embodiments, the machine 400 may comprise a mobile machine, such as, a track-type tractor or the like, for example, where the first and second electric propulsion motors 408, 409 are coupled with ground engaging elements (not shown). In embodiments, the electric propulsion motors 408, 409 are traction motors.

The power converter assembly 100 includes the electronics assembly 20 disposed within the power converter housing 120. In embodiments, a bridge 415 is positioned within the power converter housing 120 and includes a controller 420 mounted thereon. The controller 420 is in electrical connection with the electrical control connectors 92 for controlling power switching in each power module 51-56. In embodiments, the controller 420 can be configured to be electrically connected via a connector assembly or the like with a control module positioned outside of the power converter housing 120.

A coolant circulation system 430 can be provided as shown in FIG. 15 which is adapted to circulate a coolant fluid through the serpentine fluid passage 168 of the heat sink 28 for cooling components of the electronics assembly 20. The coolant circulation system 430 can include a pump 432 adapted to convey coolant to the fluid inlet 202 of the heat sink 28 such that liquid coolant enters the fluid inlet 202 of the heat sink 28, travels through the serpentine fluid passage 168, and exits the heat sink 28 via the fluid outlet 204. The fluid outlet 204 of the heat sink 28 can be in fluid communication with a radiator 435 of the coolant circulation system 4303, which in turn is in fluid communication with the pump 432 to thereby form a coolant circuit 437.

Figure 16:
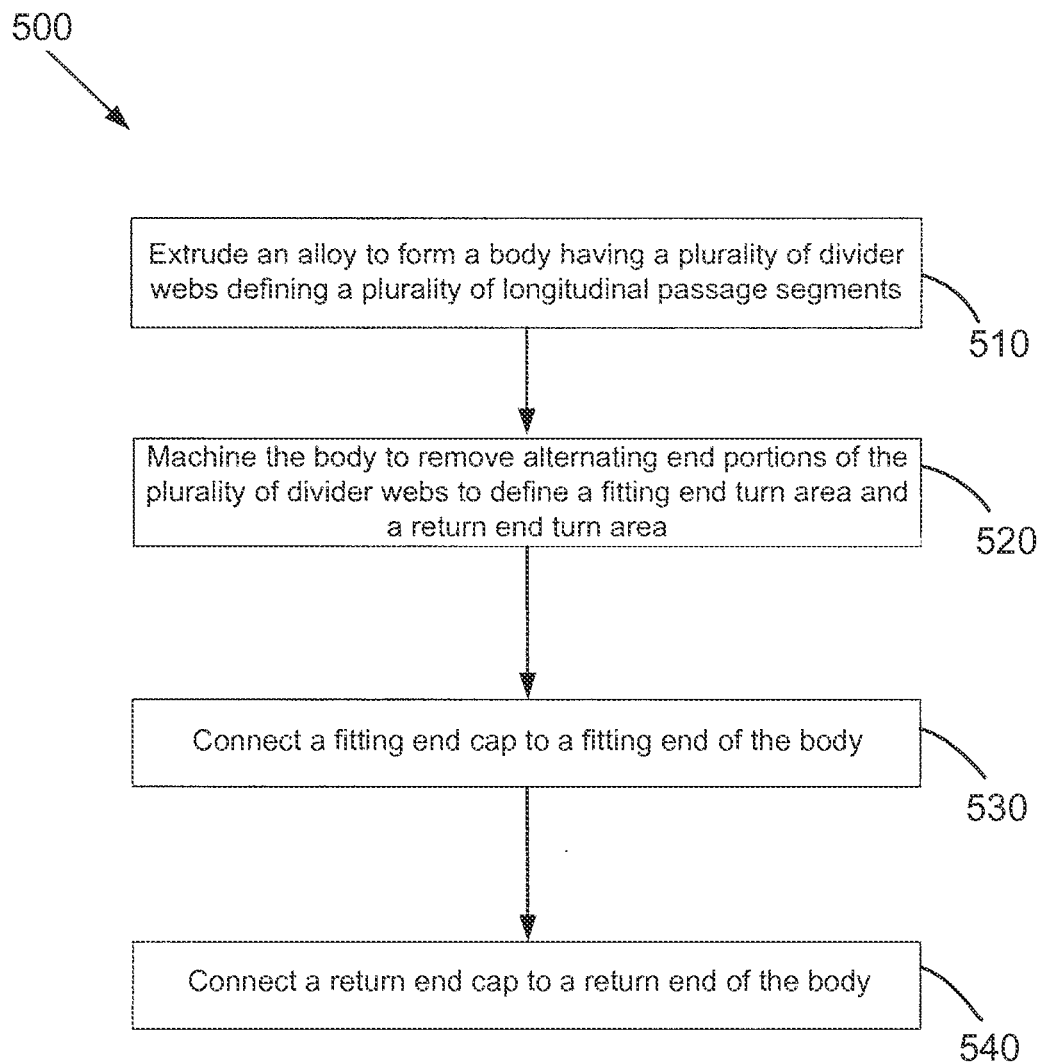
FIG. 16 is a flowchart illustrating steps of an embodiment of a method of making a heat sink following principles of the present disclosure.

Referring to FIG. 16, steps of a method of making a heat sink 500 following principles of the present disclosure are shown. In the method, an alloy can be extruded to form a body 150 (step 510). The body 150 can include a fitting end 162, a return end 164 in opposing relationship to the fitting end, and a heat transfer face 174 extending along a longitudinal axis "LA" between the fitting end 162 and the return end 164. The body 150 can be extruded such that a plurality of divider webs 261-265 of the body 150 define a plurality of longitudinal passage segments 221-226 inside the body 150. The plurality of divider webs 261-265 and the plurality of longitudinal passage segments 221-226 extend from the fitting end 162 to the return end 164. The plurality of longitudinal passage segments 221-226 is disposed in spaced relationship to each other along a lateral axis "TA" perpendicular to the longitudinal axis "LA." In embodiments, the divider webs 261-265 are integrally formed with the body 150 when the body 150 is extruded.

In embodiments, the body 150 can be extruded such that a fin 320, 322 is disposed in at least one of the plurality of longitudinal passage segments 221-226, each fin bifurcating a respective one of the plurality of longitudinal passage segments 221-226 in which that fin 320, 322 is disposed into a pair of fluid channels 325. In embodiments, the fins 320, 322 are integrally formed with the body 150 when the body 150 is extruded.

In embodiments, each fluid channel 325 has a channel width $W_2$, measured along a lateral axis "TA" perpendicular to the longitudinal axis "LA," and a channel height H, measured along a normal axis "NA" perpendicular to both the longitudinal axis "LA" and the lateral axis "TA." In embodiments, a ratio of the channel width $W_2$ to the channel height H is in a range between about 1:5 and about 1:1. In still other embodiments, the ratio of the channel width $W_2$ to the channel height H is in a range between about 1:5 and about 3:4, and in a range between about 1:5 and about 1:2 in yet other embodiments.

In embodiments, each fin 320, 322 has a fin width $W_3$, measured along the lateral axis "TA." In embodiments, a ratio of: (i) the channel width $W_2$ of each of the pair of fluid channels 325 of the respective longitudinal passage segment 221-226 in which the fin 320, 322 is disposed to (ii) the fin width $W_3$ of that fin 320, 322, is in a range between about 3:4 and about 5:4, in a range between about 3:4 to about 9:8 in still other embodiments, and in a range between about 7:8 and about 5:5 in still other embodiments.

The body 150 can be machined to remove alternating end portions of the plurality of divider webs to define a fitting end turn area 230 and a return end turn area 228 disposed adjacent the fitting end 162 and the return end 164, respectively, of the body (step 520). The machining can be performed using any suitable technique, such as by computer numerically controlled (CNC) milling, for example.

A serpentine fluid passage 168 can be defined inside the body 150 by the plurality of longitudinal passage segments 221-226, the return end turn area 228, and the fitting end turn area 230. The serpentine fluid passage 168 has a passage inlet 170 and a passage outlet 171 disposed at the fitting end 162 of the body 150.

In embodiments, the body 150 can be machined such that end portions of each fin 320, 322 are removed In embodiments, the body 150 can be machined such that at least one of the plurality of divider webs 261, 263, 265 has a restrictor portion 269 disposed in the return end turn area 228.

In embodiments, a flanking pair of the plurality of longitudinal passage segments 221, 222 can have a longitudinal fluid flow cross-sectional area 232 in a plane 234 generally perpendicular to a flow of fluid through the respective longitudinal passage segment 221, 222. The restrictor portion 269 can have a notched end 302 defining a return end fluid flow cross-sectional area 274 in a plane 275 generally perpendicular to the flow of fluid through the return end turn area 228 at the restrictor portion 269. In embodiments, a ratio of the return end fluid flow cross-sectional area 274 to the longitudinal fluid flow cross-sectional area 232 is in a range between about 9:10 and about 5:4, in a range between about 1 and about 5:4 in other embodiments, and in a range between about 1 and about 6:5 in still other embodiments. In embodiments, the return end fluid flow cross-sectional area 274 is substantially the same as the longitudinal fluid flow cross-sectional area 232.

A fitting end cap 152 can be connected to the fitting end 162 of the body 150 (step 530). In embodiments, the fitting end cap 152 can be welded to the body 150 using FSW, for example. In embodiments, controlled-atmosphere brazing or vacuum brazing can be used to connect the return end cap 154 to the body 150. In other embodiments, other suitable techniques can be used. The fitting end cap 152 defines a fluid inlet 202 and a fluid outlet 204. With the fitting end cap 152 welded to the body 150, the fluid inlet 202 and the fluid outlet 204 of the fitting end cap 152 are respectively in fluid communication with the passage inlet 170 and the passage outlet 171 of the serpentine fluid passage 168 of the body 150. In embodiments, the fluid inlet 202 and the fluid outlet 204 can be tapped to define an internal threaded surface 206, 207, respectively, configured to threadingly receive a suitable fitting of a feed line and a return line of a coolant circulation system.

A return end cap 154 can be connected to the return end 164 of the body 150 (step 540). In embodiments, the return end cap 154 can be secured to the body 150 using FSW, for example. In embodiments, controlled-atmosphere brazing or vacuum brazing can be used to connect the return end cap 154 to the body 150. In other embodiments, other suitable techniques can be used. In other embodiments, other steps can be performed to produce other embodiments of a heat sink according to principles of the present disclosure as will be appreciated from the foregoing discussion.

EXAMPLE

In this Example, the ability of a heat sink constructed according to principles of the present disclosure to be used in an assembly having an increased power module packing density was evaluated. In this Example, a power module packing factor "PF" was computed for the arrangement shown in FIG. 6. In this Example, each of the six power modules 51-56 is substantially the same, being in the form of an IGBT module. The power modules 51-56 are mounted to the heat sink 28 such that the principal module axes "$C_1$-$C_6$" of the power modules 51-56 are substantially parallel to each other and to the lateral axis "LA" of the heat sink 28. Each transverse module axis "D" of the power modules 51-56 is substantially aligned. Accordingly, the power module mounting axis "MA" is parallel to the longitudinal axis "LA" of the heat sink 28 and to the aligned transverse module axes "D" of the power modules 51-56.

Referring to FIG. 14, each power module 51-56 has a module width $W_4$, measured along the transverse module axis "D," of 89 mm. Accordingly, the module distance "MD" for this arrangement is equal to: 6×89=534 mm. The packing distance "PD" of the six power modules 51-56 is measured along the power module mounting axis "MA," which is aligned with the longitudinal axis "LA" of the heat sink 28 and the aligned transverse module axes "D" of the power modules 51-56. In this Example, the measured packing distance "PD" is equal to 555 mm. In this Example, the heat sink distance "HSD," measured from the fitting end cap 152 to the return end cap 154 along the power module mounting axis "MA," is 603 mm.

Accordingly, the power module packing factor "PF" for the arrangement of FIG. 6 was calculated as follows:

$$\text{power module packing factor} = 1 - \frac{(\text{packing distance} - \text{module distance})}{\text{module distance}},$$

$$PF_{present\ disclosure} = 1 - \frac{(555 - 534)}{534} = 0.96.$$

And, the power module density factor "DF" for the arrangement of FIG. 6 was calculated as follows:

$$\text{power module density factor} = 1 - \frac{(\text{heat sink distance} - \text{module distance})}{\text{module distance}},$$

$$DF_{present\ disclosure} = 1 - \frac{(603 - 534)}{534} = 0.87.$$

In a typical six-module array having a conventional packing configuration in a conventional power converter with a conventional cooling mechanisms (i.e., a heat sink made from a cast material), the measured packing distance was found to be about 635 mm to obtain similar heat dissipation characteristics, and the heat sink distance "HSD," measured along the power module mounting axis "MA," was 715 mm.

Accordingly, the power module packing factor "PF" for a conventional arrangement was calculated as follows:

$$\text{power module packing factor} = 1 - \frac{(\text{packing distance} - \text{module distance})}{\text{module distance}},$$

-continued $$PF_{conventional} = 1 - \frac{(635-534)}{534} = 0.81.$$

And, the power module density factor "DF" for the conventional arrangement was calculated as follows:

power module density factor =
$$1 - \frac{(\text{heat sink distance} - \text{module distance})}{\text{module distance}},$$
$$DF_{conventinoal} = 1 - \frac{(715-534)}{534} = 0.66.$$

Thus, as shown, a heat sink constructed according to principles of the present disclosure allowed for a higher packing density over a conventional arrangement. In this Example, the packing density was increased as shown by an increase in the power module packing factor "PF" from 0.81 for the conventional arrangement to 0.96 for the arrangement of FIG. 6 (about an 18% increase) and an increase in the power module density factor "DF" from 0.66 for the conventional arrangement to 0.87 for the arrangement of FIG. 6 (about a 32% increase).

INDUSTRIAL APPLICABILITY

The industrial applicability of the embodiments of a heat sink 28 and a power converter assembly 100 described herein will be readily appreciated from the foregoing discussion. Embodiments of a heat sink 28 and a power converter assembly 100 according to principles of the present disclosure may find potential application in any machine 400, such as a track-type tractor, which utilizes a multiple phase electric drive propulsion system, such as, electric drive traction power converters, for example.

Embodiments of a heat sink 28 constructed according to principles of the present disclosure include a body 150 made by an extruding process to produce a wrought alloy extrusion. The extruded body 150 can exhibit increased thermal conduction capabilities compared to a similarly configured body made by other manufacturing techniques, such as, by casting. In embodiments, the fluid channels 325 of the serpentine fluid passage 168 defined inside the body 150 can be configured to maintain the pressure drop of the coolant circulating therethrough to a predetermined limit while still providing a desired thermal conduction profile.

In an exemplary embodiment, a heat sink 28 constructed following principles of the present disclosure can be configured to accommodate a plurality of power modules 51-56 mounted thereto in abutting relationship to each other such that the power modules 51-56 define a power module footprint 330 and such that at least portions of the return end turn area 228 and the opposing fitting end turn area 230 of the heat sink 28 are disposed within the power module footprint 330. In embodiments, the fitting end cap 152 can be configured to allow for the connection of the inlet and outlet coolant lines to the heat sink 28 in a low profile package and with a reduced longitudinal length that is only slightly longer than the threaded portion of the fittings of the inlet and outlet coolant lines. Embodiments of a heat sink 28 constructed according to principles of the present disclosure can allow for an especially dense packing arrangement of power modules compared to conventional approaches.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for the features of interest, but not to exclude such from the scope of the disclosure entirely unless otherwise specifically indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

What is claimed is:

1. A heat sink comprising:
a body including a fitting end, a return end in opposing relationship to the fitting end, and a heat transfer face extending along a longitudinal axis between the fitting end and the return end, the body defining a serpentine fluid passage inside the body, the serpentine fluid passage having a passage inlet and a passage outlet disposed at the fitting end;
a fitting end cap connected to the fitting end of the body, the fitting end cap defining a fluid inlet and a fluid outlet respectively in fluid communication with the passage inlet and the passage outlet of the serpentine fluid passage;
wherein the serpentine fluid passage includes a pair of longitudinal passage segments and a return end turn area, the pair of longitudinal passage segments in fluid communication with each other through the return end turn area, each of the pair of longitudinal passage segments having a longitudinal fluid flow cross-sectional area in a plane generally perpendicular to a flow of fluid through the respective longitudinal passage segment, the body including a divider web interposed between the pair of longitudinal passage segments, the divider web including a restrictor portion disposed in the return end turn area, the restrictor portion having a notched end defining a return end fluid flow cross-sectional area in a plane generally perpendicular to the flow of fluid through the return end turn area at the restrictor portion, a ratio of the return end fluid flow cross-sectional area to the longitudinal fluid flow cross-sectional area being in a range between about 9:10 and about 5:4.

2. The heat sink of claim 1, wherein the divider web of the body includes at least one power module mounting hole adapted to receive a mounting fastener therein for securing a power module to the body such that the power module is in heat transferring relationship with the heat transfer face of the body.

3. The heat sink of claim 1, wherein the return end fluid flow cross-sectional area is substantially the same as the longitudinal fluid flow cross-sectional area.

4. The heat sink of claim 1, wherein the body includes a fin disposed in each of the pair of longitudinal passage segments, the respective fin bifurcating each of the pair of longitudinal passage segments into a pair of fluid channels, each of the pair of fluid channels having a channel width, measured along a lateral axis perpendicular to the longitudinal axis, and a channel height, measured along a normal axis perpendicular to both the longitudinal axis and the lateral axis, and a ratio of the channel width to the channel height being in a range between about 1:5 and about 1:1.

5. The heat sink of claim 4, wherein the ratio of the channel width to the channel height is in a range between about 1:5 and about 3:4.

6. The heat sink of claim 4, wherein the ratio of the channel width to the channel height is in a range between about 1:5 and about 1:2.

7. The heat sink of claim 4, wherein each fin has a fin width, measured along the lateral axis, and a ratio of: (i) the channel width of each of the pair of fluid channels of the respective longitudinal passage segment in which said fin is disposed to (ii) the fin width of said fin, is in a range between about 3:4 and about 5:4.

8. The heat sink of claim 1, wherein the body includes a fin disposed in each of the pair of longitudinal passage segments, the respective fin bifurcating each of the pair of longitudinal passage segments into a pair of fluid channels, each of the pair of fluid channels having a channel width, measured along a lateral axis perpendicular to the longitudinal axis, and a channel height, measured along a normal axis perpendicular to both the longitudinal axis and the lateral axis, each respective fin having a fin width, measured along the lateral axis, and a ratio of: (i) the channel width of each of the pair of fluid channels of the respective longitudinal passage segment in which said fin is disposed to (ii) the fin width of said fin, is in a range between about 3:4 and about 5:4.

\* \* \* \* \*